United States Patent
DiJaili et al.

(10) Patent No.: US 6,891,664 B2
(45) Date of Patent: *May 10, 2005

(54) MULTISTAGE TUNABLE GAIN OPTICAL AMPLIFIER

(75) Inventors: Sol P. DiJaili, Moraga, CA (US); John M. Wachsman, Dublin, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/967,859

(22) Filed: Sep. 28, 2001

(65) Prior Publication Data

US 2004/0017604 A1 Jan. 29, 2004

Related U.S. Application Data

(63) Continuation-in-part of application No. 09/416,817, filed on Oct. 12, 1999, now Pat. No. 6,512,629, which is a continuation-in-part of application No. 09/273,813, filed on Mar. 22, 1999, now Pat. No. 6,445,495.
(60) Provisional application No. 60/274,553, filed on Mar. 9, 2001.

(51) Int. Cl.[7] .................................................. H01S 3/00
(52) U.S. Cl. ...................................................... 359/344
(58) Field of Search ......................................... 359/344

(56) References Cited

U.S. PATENT DOCUMENTS

| | | | |
|---|---|---|---|
| 3,467,906 A | 9/1969 | Comely et al. ............... | 330/4.3 |
| 3,828,231 A | 8/1974 | Yamamoto ................... | 317/235 |
| 4,794,346 A | 12/1988 | Miller ........................ | 330/4.3 |
| 5,301,201 A | 4/1994 | Dutta et al. .................... | 372/43 |
| 5,331,654 A | 7/1994 | Jewell et al. .................. | 372/45 |
| 5,371,757 A | 12/1994 | Largent ........................ | 372/50 |
| 5,436,759 A | 7/1995 | DiJaili et al. ................ | 359/333 |
| 5,457,569 A | 10/1995 | Liou et al. .................... | 359/344 |
| 5,539,571 A | 7/1996 | Welch et al. ................ | 359/344 |
| 5,673,141 A * | 9/1997 | Gambini ................... | 359/341.1 |
| 5,748,653 A | 5/1998 | Parker et al. ................... | 372/8 |
| 5,793,521 A | 8/1998 | O'Brien et al. ............. | 359/344 |

(Continued)

FOREIGN PATENT DOCUMENTS

| | | | |
|---|---|---|---|
| JP | 56006492 | 1/1981 | ............. H01S/3/18 |
| JP | 01129483 | 11/1987 | ............. H01S/3/18 |
| JP | 10190147 | 7/1998 | ............. H01S/3/18 |

OTHER PUBLICATIONS

Giuliani et al. Noise Analysis of Conventional and Gain–Clamped Semiconductor Optical Amplifiers. Journal of Lightwave Technology. vol. 18. No. 9. Sep. 2000. pp. 1256–1263.q.*

(Continued)

Primary Examiner—Thomas H. Tarcza
Assistant Examiner—Deandra M. Hughes
(74) Attorney, Agent, or Firm—Workman Nydegger

(57) ABSTRACT

A multi-stage tunable gain optical amplifier device amplifies an optical signal by a gain amount which can be adjusted in one of the stages of the amplifier. The multi-stage amplifier includes at least two optical amplifier stages coupled in series, one of which is a tunable gain amplifier stage. The optical amplifier stages are characterized by a design parameter which varies from stage to stage. In a preferred embodiment, the design parameter includes a noise figure and a saturable power, with both parameters increasing as the optical signal propagates from stage to stage. As a result, the multi-stage tunable gain optical amplifier can achieve better noise performance and higher output power than a single stage optical amplifier with a constant noise figure and saturable power.

16 Claims, 23 Drawing Sheets

U.S. PATENT DOCUMENTS

| | | | |
|---|---|---|---|
| 5,946,438 A | 8/1999 | Minot et al. | 385/88 |
| 6,040,938 A | 3/2000 | Ducellier | 359/344 |
| 6,160,834 A | 12/2000 | Scott | 372/96 |
| 6,252,896 B1 | 6/2001 | Tan et al. | 372/50 |
| 6,263,002 B1 | 7/2001 | Hsu et al. | 372/6 |
| 6,445,495 B1 * | 9/2002 | Walker et al. | 359/344 |
| 6,512,629 B1 * | 1/2003 | Dijaili et al. | 359/344 |
| 6,560,010 B1 * | 5/2003 | DiJaili et al. | 359/344 |
| 6,563,631 B2 * | 5/2003 | Delprat et al. | 359/344 |
| 6,704,138 B2 * | 3/2004 | Dijaili et al. | 359/344 |

OTHER PUBLICATIONS

Agrawal, Govind. Fiber–Optic Communication Systems. 2nd Edition. John Wiley & Sons, Inc. 1997. pp. 93–95.*

"Clamped Gain Travelling Wave Semiconductor Optical Amplifier as a Large Dynamic Range Optical Gate;" G. Soulage, P. Doussiere, A. Jourdan, M. Sotom.

"1310–nm DBR–Type MQW Gain–Clamped Semiconductor Optical Amplifiers with AM–CATV–Grade Linearity;" L.F. Tiemeijer, G.N. van den Hoven, P.J.A. Thijs, T. van Dongen, J.J.M. Binsma, E.J. Jansen; IEEE Photonics Technology Letters, vol. 8, No. 11; Nov. 1996.

"High–Gain 1310 nm Semiconductor Optical Amplifier Modules with a Built–in Amplified Signal Monitor for Optical Gain Control;" L.F. Tiemeijer, S. Walczyk, A.J.M. Verboven, G.N. van den Hoven, P.J.A. Thijs, T. van Dongen, J.J.M. Binsma, E.J. Jansen; IEEE Photonics Technology Letters, vol. 9, No. 3; Mar. 1997.

"Reduced Intermodulation Distortion in 1300 nm Gain–Clamped MQW Laser Amplifiers;" L.F. Tiemeijer, P.J.A. Thijs, T. v. Dongen, J.J.M. Binsma, E.J. Jansen, H.R.J.R. van Helleputte; IEEE Photonics Technology Letters, vol. 7, No. 3; Mar. 1995.

"A Gain–Clamped, Crosstalk Free, Vertical Cavity Lasing Semiconductor Optical Amplifier for WDM Applications;" J.D. Walker, F.G. Patterson, S.P. Dijaili, R.J. Deri.

"Multiple–Quantum–Well GaInAs / GaInAsP Tapered Broad– Area Amplifiers with Monolithically Integrated Waveguide Lens for High–Power Applications;" F. Koyama, K.Y. Liou, A.G. Dentai, T. Tanbun–ek, C.A. Burrus; IEEE Photonics Technology Letters, vol. 5, No. 8; Aug. 1993.

Alcatel, "Alcatel Optronics introduces a Gain–Clamped Semiconductor Optical Amplifier," *Press Release for Immediate Publication*, OFC '98, San Jose (Feb. 1998), 1 unnumbered page.

Bauer, B. et al., "Gain Stabilization of a Semiconductor Optical Amplifier by Distributed Feedback," *IEEE Photonics Technology Letters*, vol. 6, No. 2 (Feb. 1994), pp. 182–185.

Doussiere, P. et al., "Clamped Gain Travelling Wave Semiconductor Optical Amplifier for Wavelength Division Multiplexing Applications," Maui, Hawaii, Sep. 19–23, 1994, New York, IEEE, US, vol. Conf. 14 (Sep. 14, 1994), pp. 185–186.

Gee, S. et al., "High–Power Mode–Locked External Cavity Semiconductor Laser Using Inverse Bow–Tie Semiconductor Optical Amplifiers," *IEEE Journal of Selected Topics in Quantum Electronics*, vol. 4, No. 2, Mar./Apr. 1998, pp. 209–215.

Koyama, F., et al., "Multiple–Quantum–Well GaInAs/GaInAsP Tapered Broad–Area Amplifiers with Monolithically Integrated Waveguide Lens for High–Power Applications," *IEEE Photonics Technology Letters* (Aug. 1993), vol. 5, No. 8, pp. 916–919.

McAdams, L.R. et al., "Linearizing High Performance Semiconductor Optical Amplifiers: Techniques and Performance," LEOS Presentation (1996), pp. 363–364.

Mutalik, V.G. et al., "Analog performance of 1310–nm gain–clamped semiconductor optical amplifiers," *OFC '97 Technical Digest*, Thursday Morning, 11:15 AM, pp. 266–267.

Simon, J.C. et al., "Travelling wave semiconductor optical amplifier with reduced nonlinear distortions," *Electronics Letters*, vol. 30, No. 1 (Jan. 6, 1994), pp. 49–50.

* cited by examiner

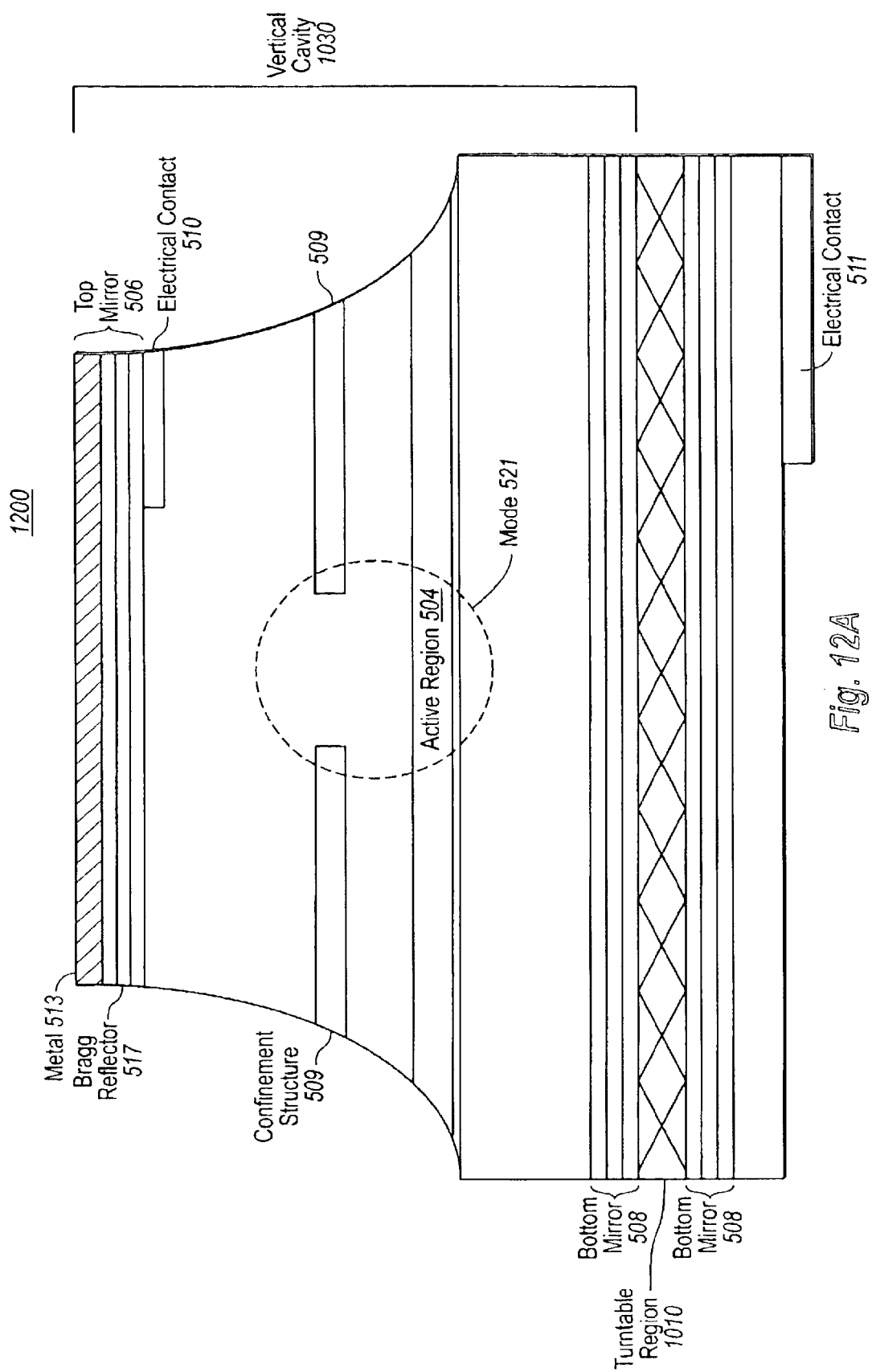

MULTISTAGE TUNABLE GAIN OPTICAL AMPLIFIER

CROSS-REFERENCE TO RELATED APPLICATIONS

This application claims benefit of U.S. Provisional Patent Application Ser. No. 60/274,553, "Multistage, Variable Gain Optical Amplifier," by Sol P. Dijaili and John M. Wachsman, filed Mar. 9, 2001.

This application is a continuation-in-part of U.S. patent application Ser. No. 09/273,813, "Tunable-gain Lasing Semiconductor Optical Amplifier", by Jeffrey D. Walker, Sol P. Dijaili and Daniel A. Francis, filed Mar. 22, 1999 now U.S. Pat. No. 6,445,495. This application is also a continuation-in-part of U.S. patent application Ser. No. 09/416,817, "Low-Noise, High-Power Optical Amplifier," by Sol P. Dijaili and Jeffrey D. Walker, filed Oct. 12, 1999 now U.S. Pat. No. 6,512,629.

The subject matter of all of the foregoing is incorporated herein by reference.

BACKGROUND OF THE INVENTION

1. Field of the Invention

The present invention relates to optical communications systems and, more particularly, to optical amplifiers.

2. Description of the Related Art

As the result of continuous advances in technology, particularly in the area of networking such as the Internet, there is an increasing demand for communications bandwidth. For example, the transmission of data over a telephone company's trunk lines, the transmission of images or video over the Internet, the transfer of large amounts of data as might be required in transaction processing, or videoconferencing implemented over a public telephone network typically require the high speed transmission of large amounts of data. As applications such as these become more prevalent, the demand for communications bandwidth capacity will only increase.

Optical fiber is a transmission medium that is well suited to meet this increasing demand. Optical fiber has an inherent bandwidth that is much greater than metal-based conductors, such as twisted pair or coaxial cable; and protocols such as the OC protocol have been developed for the transmission of data over optical fibers. Typical communications system based on optical fibers include a transmitter, an optical fiber, and a receiver. The transmitter converts the data to be communicated into an optical form and then transmits the resulting optical signal via the optical fiber to the receiver. The receiver recovers the original data from the received optical signal.

Optical amplifiers, which boost the power of the optical signal propagating through the optical fiber, are an important component in such fiber communications systems. For example, receivers typically operate properly only within a relatively narrow range of optical signal power levels; optical amplifiers can be used to boost the received optical signal to the proper power range for the receiver. As another example, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers may be used to compensate for these attenuations. Conventional optical amplifiers, however, suffer from various drawbacks.

Fiber amplifiers are one type of conventional optical amplifier. They include a length of fiber which has been doped to form an active gain medium. Ions of rare-earth metals, such as erbium, are typically used as the dopant. The doped fiber is typically pumped by an optical pump at a wavelength which is preferentially absorbed by the ions but different from the wavelength of the optical signal to be amplified. The pumping results in a population inversion of electronic carriers in the active medium. Then, as the optical signal propagates through the doped fiber, it is amplified due to stimulated emission.

One drawback of fiber amplifiers is that they typically can only operate over a narrow wavelength range when multiple fiber amplifiers are cascaded. This is especially problematic if the optical signal to be amplified covers a wide range of wavelengths, as would be the case if the entire bandwidth of the optical fiber were to be efficiently utilized. Another disadvantage of fiber amplifiers is their transient response to channel drop-out in wavelength division multiplexing systems. Further problems with fiber amplifiers include their relatively large size, slow switching speed, power inefficiency, difficulties in mass producing them, and their high cost which makes them prohibitively expensive for many applications.

Non-lasing semiconductor optical amplifiers (SOAs) are an alternative to fiber amplifiers. Non-lasing semiconductor optical amplifiers are typically based on a semiconductor laser-like structure which is operated below the lasing threshold. Typically, an electrical current pumps the active region of the amplifier, resulting in an increased carrier population. The optical signal then experiences gain as it propagates through the active region due to stimulated emission.

One problem with non-lasing semiconductor optical amplifiers is that the gain depends on the amplitude of the optical signal. For example, a strong optical signal will be amplified less than a weak signal and strong portions of the optical signal will be amplified less than weak portions. This results in distortion of the optical signal and possibly also crosstalk between different optical signals propagating simultaneously through the system. This problem is the result of gain saturation, in which there are insufficient carriers in the conduction band to provide the full amount of gain to higher power signals.

Lasing semiconductor optical amplifiers can overcome the problem of gain saturation. These amplifiers are also based on a semiconductor active region. However, the active region is pumped above the lasing threshold. The gain is then clamped due to the lasing action and is fairly constant until the amplifier reaches its power limit.

However, lasing semiconductor optical amplifiers also suffer from inherent drawbacks. For example, there is an inherent tradeoff between noise performance and power output. If the carrier density at the lasing threshold is high, the amplifier will have good noise performance but will have a low saturable power thus limiting its power output. On the other hand, an amplifier with a low carrier density at the lasing threshold will be capable of large power output but suffer from poor noise performance. This inherent tradeoff makes it difficult for a lasing semiconductor optical amplifier to attain both a low noise and a high power output.

Lasing semiconductor optical amplifiers are also limited in that the gain of the amplifier typically cannot be adjusted in order to accommodate different optical signals that propagate through the amplifier. For example, optical receivers typically operate properly only within a relatively narrow range of optical signal power levels. The ability to adjust or tune the gain of an optical amplifier would be beneficial because it would allow the amplifier to dynamically provide the appropriate gain to the optical signal so that it falls within the range of the optical receivers.

Thus, there is a need for an optical amplifier which does not suffer from gain saturation and is also capable of both low noise and high power output. In addition, there is also a need for an optical amplifier whose gain can be adjusted or tuned during operation of the optical amplifier.

SUMMARY OF THE INVENTION

In accordance with the present invention, a multi-stage tunable gain optical amplifier device for amplifying an optical signal includes at least two optical amplifier stages coupled in series. In an embodiment, one of the optical amplifier stages comprises a gain medium having an amplifying path for amplifying an optical signal. The second optical amplifier stage is a tunable-gain lasing semiconductor optical amplifier (SOA) stage comprising a semiconductor gain medium having an amplifying path for amplifying an optical signal propagating along the amplifying path and a laser cavity. The laser cavity is pumped above a lasing threshold to clamp the gain of the semiconductor gain medium to a constant value. The overall gain of the tunable-gain lasing SOA stage is tunable.

In one embodiment, the optical amplifier stage precedes the tunable gain lasing SOA stage and has better noise performance than the tunable gain lasing SOA stage. This stage is also referred to as the pre-amplification stage. In another embodiment, the tunable gain lasing SOA stage precedes the optical amplifier stage and the optical amplifier stage has a higher output power than the tunable-gain lasing SOA stage. This stage is also referred to as the booster stage.

In another embodiment of the invention, a third optical amplifier stage is added to the multi-stage tunable gain optical amplifier described above. In this embodiment, the first optical amplifier stage is designed to provide good noise performance. The third optical amplifier stage is designed to produce a high output power. The tunable-gain optical amplifier stage allows the overall gain of the multi-stage tunable gain optical amplifier to be tuned by adjusting the gain value of the tunable gain optical amplifier stage.

In accordance with the present invention, a method for amplifying an optical signal by a multi-stage tunable gain optical amplifier is disclosed. The method comprises receiving an optical signal and amplifying the optical signal as it propagates through an optical amplifier stage. The optical signal is also amplified by a tunable gain lasing semiconductor optical amplifier stage whose gain can be adjusted.

The present invention is particularly advantageous because varying the noise figure and saturable power from stage to stage, results in better noise performance and higher saturable power for the multi-stage tunable gain optical amplifier than is possible in a single stage optical amplifier providing the same output power. In addition, since one of the optical amplifier stages is capable of adjusting the gain of that stage, the overall amplification of optical amplifier is tunable.

BRIEF DESCRIPTION OF THE DRAWINGS

The invention has other advantages and features which will be more readily apparent from the following detailed description of the invention and the appended claims, when taken in conjunction with the accompanying drawing, in which:

FIG. 12A is a cross-sectional diagram of a tunable-gain VLSOA 1200 which includes a tunable region 1010 between a bottom cavity mirror 508 and an additional mirror 1210 according to a preferred embodiment of the present invention;

DETAILED DESCRIPTION OF THE PREFERRED EMBODIMENTS

Figure 1:
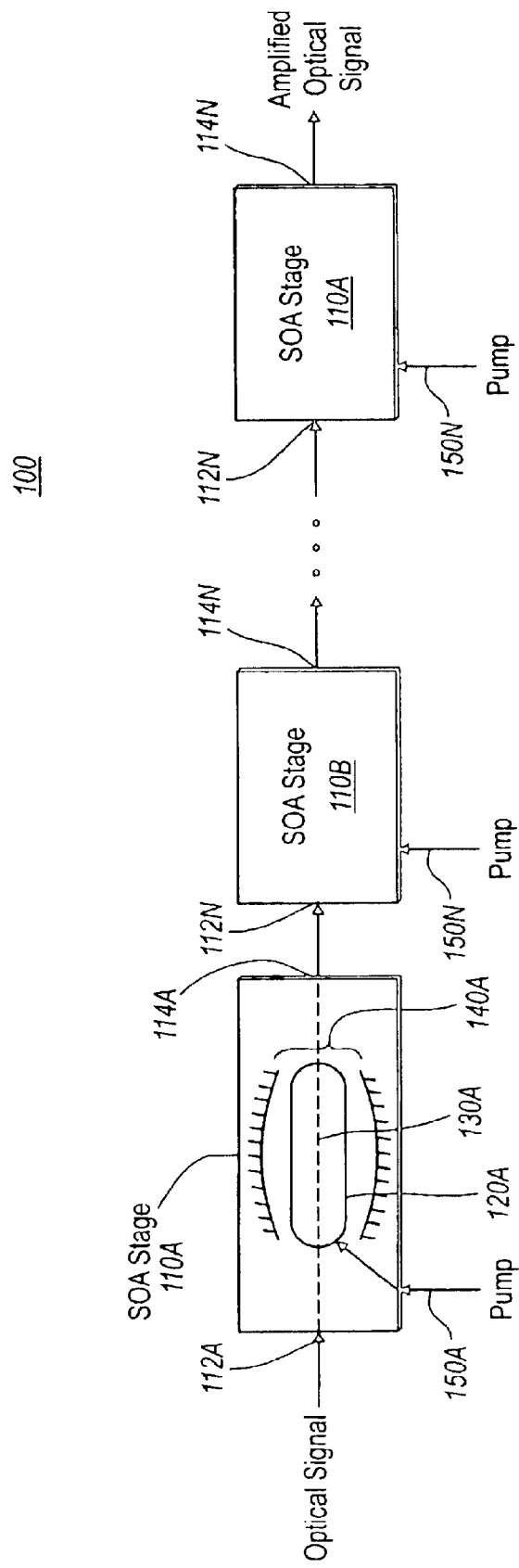
FIG. 1 is a diagram of a multi-stage lasing semiconductor optical amplifier (SOA) 100 in accordance with the present invention.

FIG. 1 is a diagram of a multi-stage lasing semiconductor optical amplifier (SOA) 100 in accordance with the present invention. The SOA 100 includes a number of SOA stages 110A–110N (collectively, SOA stages 110). Each SOA stage 110 has an input 112 and an output 114 and the SOA stages 110 are coupled in series with the output of each SOA stage 110 coupled to the input of the next SOA stage 110. As shown in the detail of SOA stage 110A, each SOA stage 110 includes a semiconductor gain medium 120, with an amplifying path 130 coupled between the input 112 and the output 114 of the SOA stage 110 and traveling through the semiconductor gain medium 120. Each SOA stage 110 further includes a laser cavity 140 including the semiconductor gain medium 120, and a pump input 150 coupled to the semiconductor gain medium 120. The pump input is for receiving a pump to pump the semiconductor gain medium 120 above a lasing threshold for the laser cavity 140. The SOA stages 110 are not identical in that the SOA stages 110 may be described by design parameters and the value of at least one design parameter differs from stage to stage. This results in significant advantages over SOAs which are constructed of identical stages, as will be apparent below.

Figure 2:
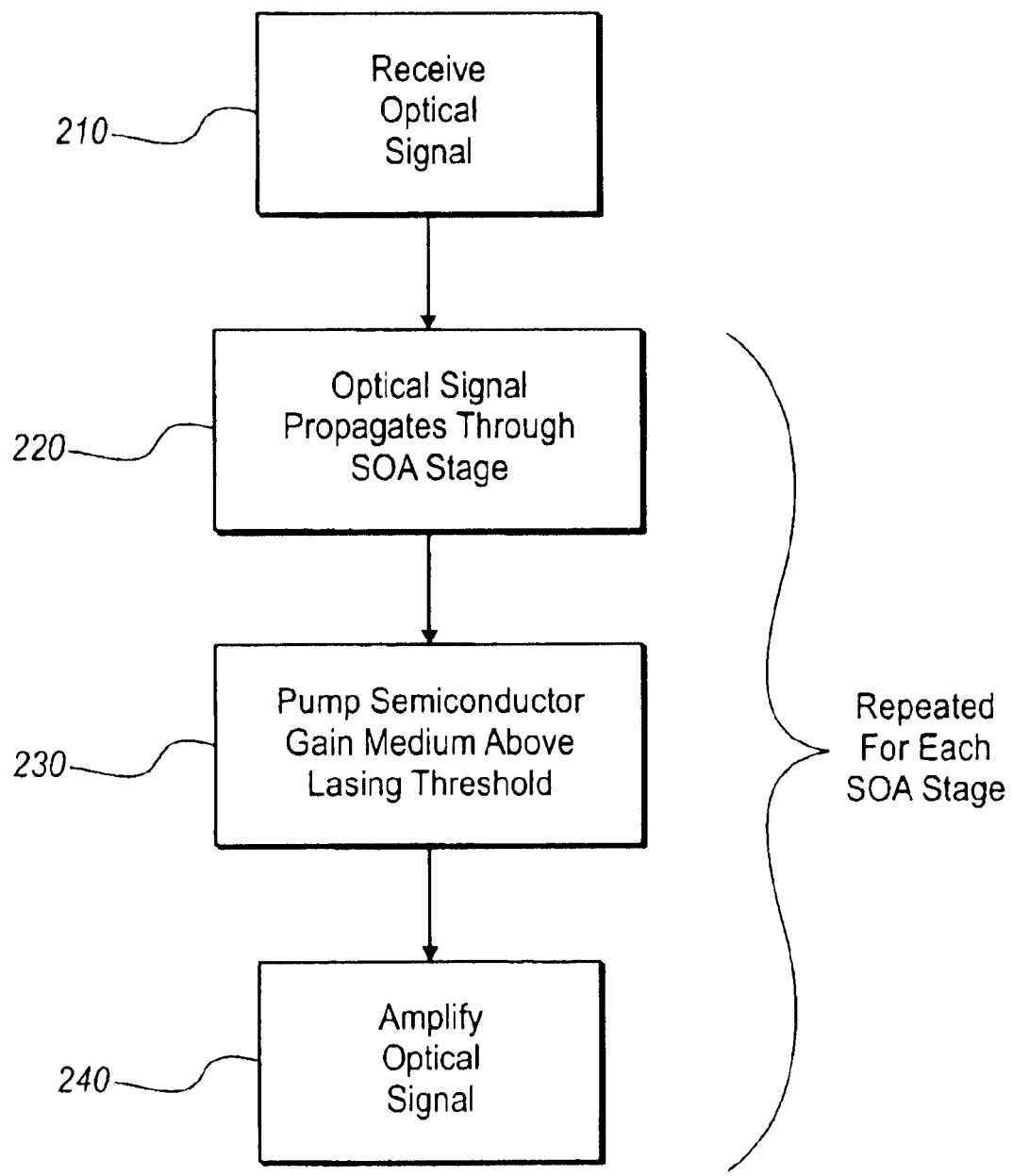
FIG. 2 is a flow diagram illustrating operation of SOA 100.

Overall, the SOA 100 receives an optical signal at the first input 112A, amplifies the optical signal as it propagates through the SOA 100 along the amplifying paths 130, and outputs the amplified optical signal from the last output 114N. FIG. 2 is a flow diagram illustrating operation of SOA 100 in more detail. The SOA 100 receives 210 an optical signal at the input 112A of the first SOA stage 110A. The optical signal propagates 220 through the first SOA stage 110A along the amplifying path 130A. The pump received at pump input 150A pumps 230 the semiconductor gain medium 120A of the first SOA stage 110A above a lasing threshold for the laser cavity 140A. When lasing occurs, the round-trip gain offsets the round-trip losses for the laser cavity 140A. In other words, the gain of the semiconductor gain medium 120A is clamped to the gain value necessary to offset the round-trip losses. The optical signal is amplified 240 according to this gain value as it propagates along the amplifying path 130A (i.e., through the semiconductor gain medium 120A). Steps 220, 230 and 240 are repeated in each SOA stage 110, resulting in an amplified optical signal which exits via the output 114N of the last SOA stage 110N.

Note that the gain experienced by the optical signal as it propagates through each SOA stage 110 is determined in part by the gain value of the semiconductor gain medium 120 (it is also determined, for example, by the length of the amplifying path 130) and this gain value, in turn, is determined primarily by the lasing threshold for the laser cavity 140. In particular, the gain experienced by the optical signal as it propagates through each SOA stage 110 is substantially independent of the amplitude of the optical signal. This is in direct contrast to the situation with non-lasing SOAs and overcomes the distortion and crosstalk disadvantages typical of non-lasing SOAs. This assumes, of course, that each SOA stage 110 is operating within its power limits (i.e., that none of the SOA stages 110 has reached its saturable power limit) as will be further discussed below.

Figure 3A:
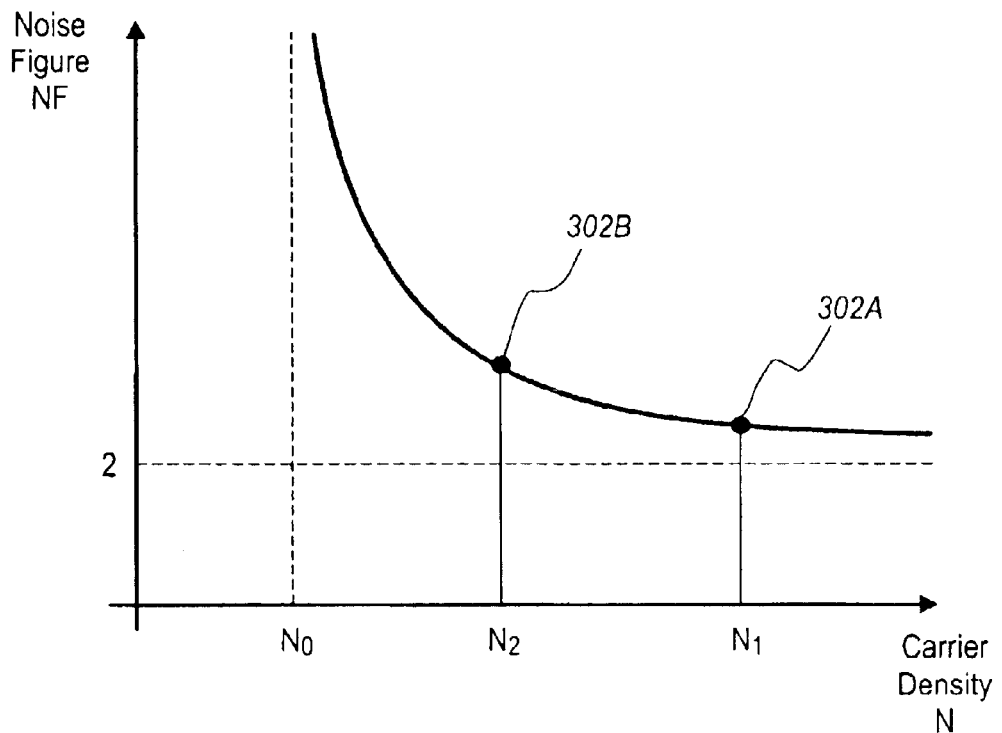
FIG. 3A is a graph of noise figure as a function of carrier density at the lasing threshold for an SOA.
Figure 3B:
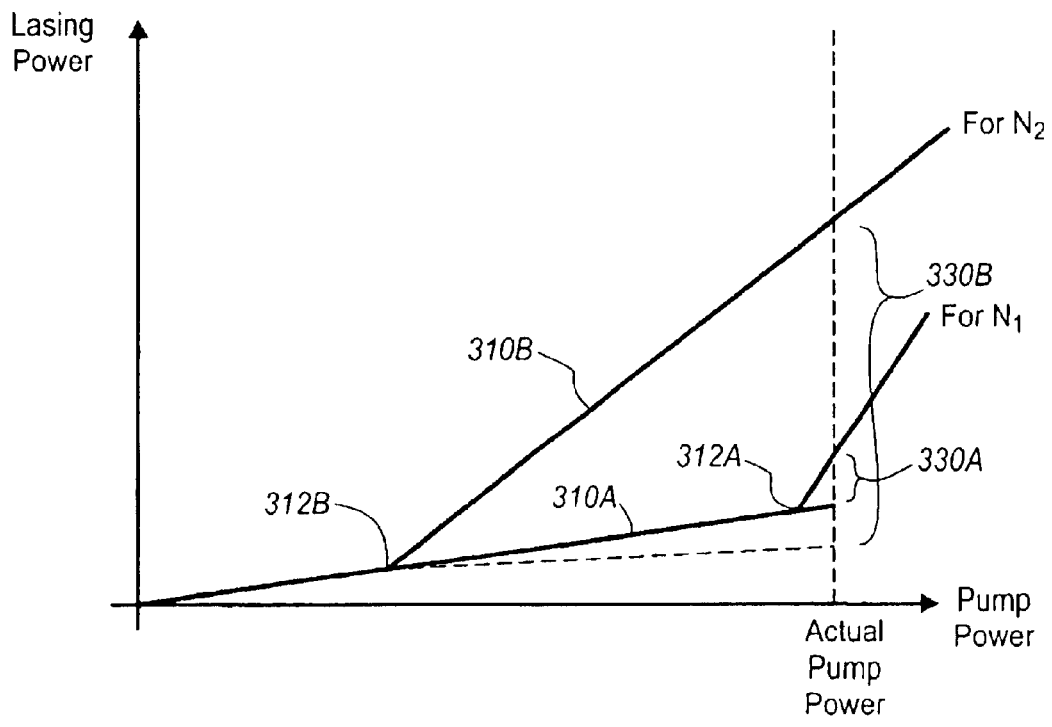
FIG. 3B is a graph of lasing power as a function of pump power.
Figure 3C:
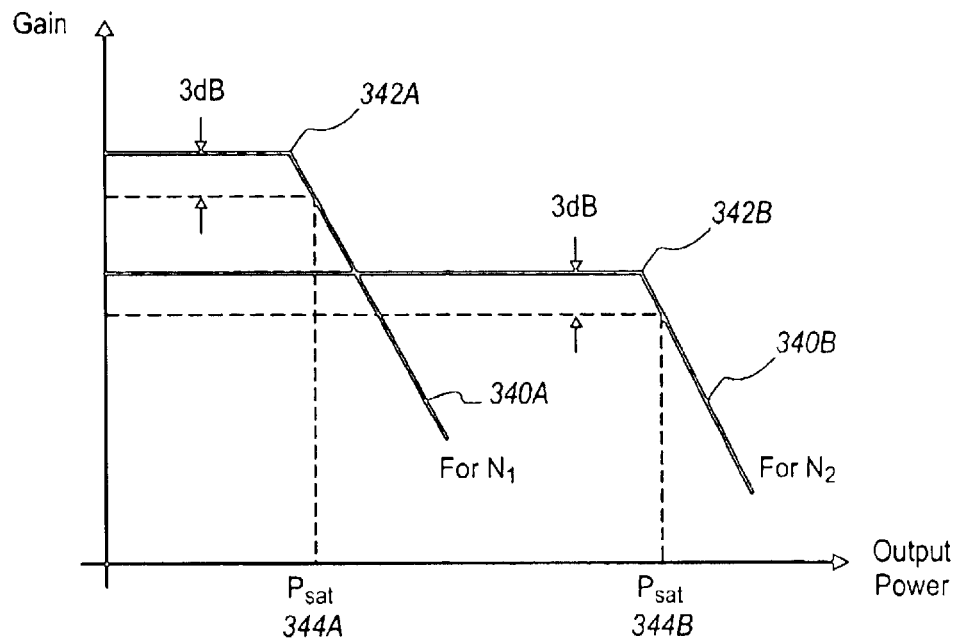
FIG. 3C is a graph of gain as a function of output power.

FIGS. 3A–3C are graphs used to illustrate a preferred embodiment of SOA 100. Referring first to FIG. 3A, this graph shows noise figure (NF) as a function of carrier density at the lasing threshold for the SOA stage (N). NF for an SOA stage 110 is a measure of the noise performance of the stage and is defined as the ratio of the signal-to-noise ratio at the input 112 of the stage to the signal-to-noise ratio at the output 114 of the stage. Noise performance may also be measured using other performance metrics, but for clarity and consistency, NF will be used throughout this disclosure. It should be noted, however, that the invention is not limited to using NF as the noise performance metric. Lower NF indicates better noise performance. N is as follows. During operation of the SOA stage 110, the pump increases the carrier density in the semiconductor gain medium 120, typically by increasing the electron population in the conduction band (e.g., by injecting electrons into the conduction band), increasing the hole population in the valence band, or both. The recombination of carriers results in the emission of radiation which forms the basis for the beam produced by the laser cavity 140. N is the carrier density required to reach the lasing threshold for the laser cavity 140 of SOA stage 110. NF may be approximated by the equation NF=$2 N/(N-N_0)$, where N is the carrier density at the lasing threshold and $N_0$ is the carrier density for the transparency energy state for the semiconductor gain medium 120. As shown in FIG. 3A and the previous equation, NF decreases as N increases. In particular, an SOA stage 110 which has a higher value of N (e.g., $N_1$ in FIG. 3A) will have a lower NF 302A and better noise performance. Conversely, an SOA stage 110 with a lower value of N (e.g., $N_2$) will have a higher NF 302B and worse noise performance.

FIG. 3B is a graph depicting lasing power as a function of pump power for carrier densities $N_1$ and $N_2$. The lasing power is the power of the beam produced by the laser cavity 140, which is not necessarily a laser (e.g., if the laser cavity is operating below the lasing threshold). The pump power is the power used to pump the laser cavity 140. The two curves 310A and 310B correspond to higher and lower values of N (i.e., $N_1$ and $N_2$ respectively). In both curves, there is a knee 312 which represents the onset of lasing. To the left of this knee 312, the beam produced by laser cavity 140 is more similar to that produced by an LED. To the right of this knee, the beam is a laser beam. Note that the knee 312A for the $N_1$ case occurs at a higher pump power than the knee 312B for the $N_2$ case. Assuming that the same pump power 320 is used in both cases, which is common since the pump power is usually limited by other factors such as thermal dissipation, this means that the laser power 330A produced in the $N_1$ case is less than the laser power 330B produced in the $N_2$ case.

This, in turn, affects amplification of the optical signal as shown in FIG. 3C, which graphs gain as a function of output power for the $N_1$ and $N_2$ cases. Here, gain is the gain experienced by the optical signal as it propagates through an SOA stage 110. Output power is the power of the amplified signal as it exits the SOA stage 110. Both curves 340A (for $N_1$) and 340B (for $N_2$) are similar in shape: essentially flat out to a shoulder 342 (due to the gain clamping from the onset of lasing) but rolling off rapidly after the shoulder 342. The shoulder 342 represents the power limit for the SOA stage 110. It is the point at which so much power is directed to amplifying the optical signal that lasing begins to be extinguished. Referring again to FIG. 3B, the laser power 330A for the $N_1$ case is less than that 330B for the $N_2$ case and so lasing will be extinguished at a lower output power for the $N_1$ case. As a result, the shoulder 342A for the $N_1$ case occurs at a lower output power than for the $N_2$ case. The saturable power (Psat) is defined as the output power at which the gain has rolled off by 3 dB and is a measure of an output power limit. Analogously to noise performance and NF, the output power limit may be measured using performance metrics other than the saturable power Psat. However, for clarity and consistency, Psat will be used throughout this disclosure but the invention is not limited to using Psat as the metric for output power limit. The saturable power 344A for the $N_1$ case is less than that 344B for the $N_2$ case, meaning that the $N_2$ case can output a higher power amplified optical signal than the $N_1$ case. Note that the saturable power 344 for an SOA stage 110 may be selected by selecting an appropriate value of N. In other words, the saturable power is a design parameter; whereas it typically is not for non-lasing SOAs. This is a significant advantage, as will be seen.

Considering FIGS. 3A–3C together reveals an inherent tradeoff. Good noise performance requires a high N (e.g., $N_1$) but high power output requires a low N (e.g., $N_2$). A single SOA stage cannot achieve both. However, the situation may be improved by a multi-stage SOA 100 as further described below.

Figure 4A:
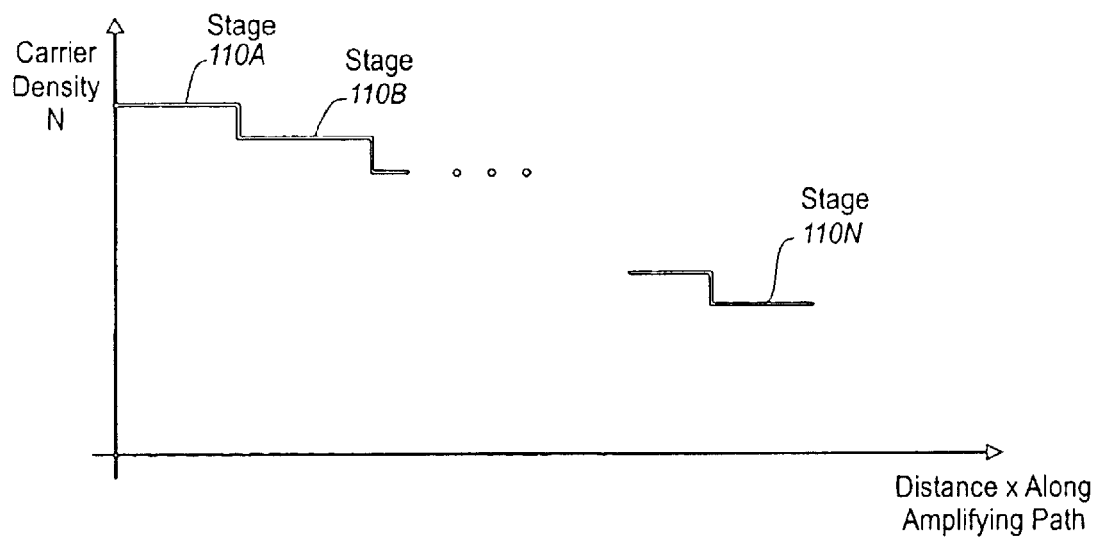
FIG. 4A is a graph of carrier density at the lasing threshold as a function of distance along the amplifying path according to a preferred embodiment of multi-stage SOA 100.
Figure 4B:
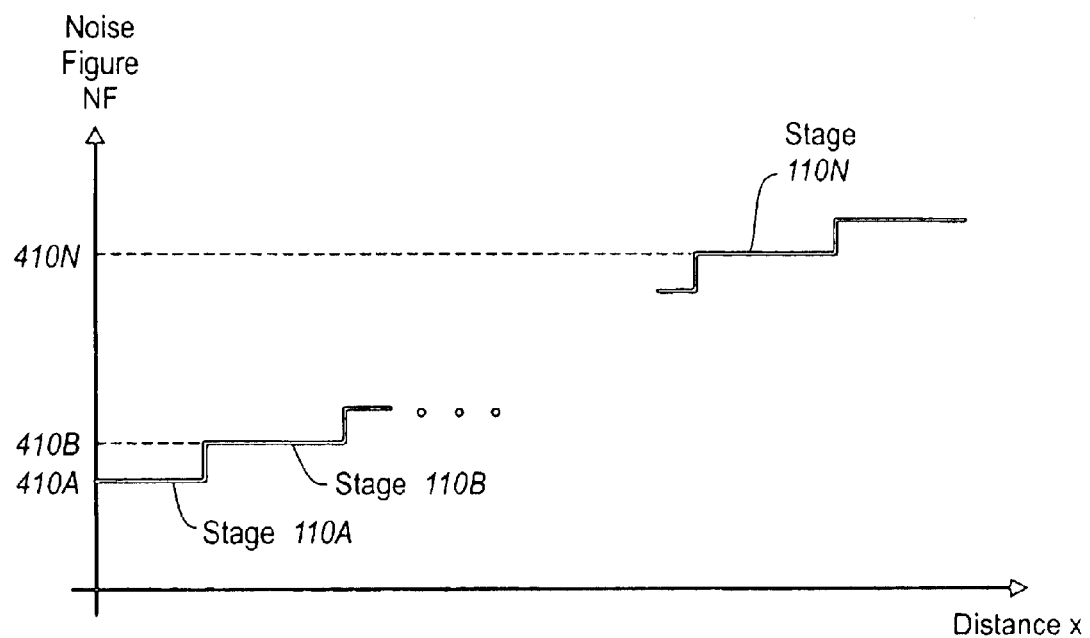
FIG. 4B is a graph of noise figure along the amplifying path for the same preferred embodiment.
Figure 4C:
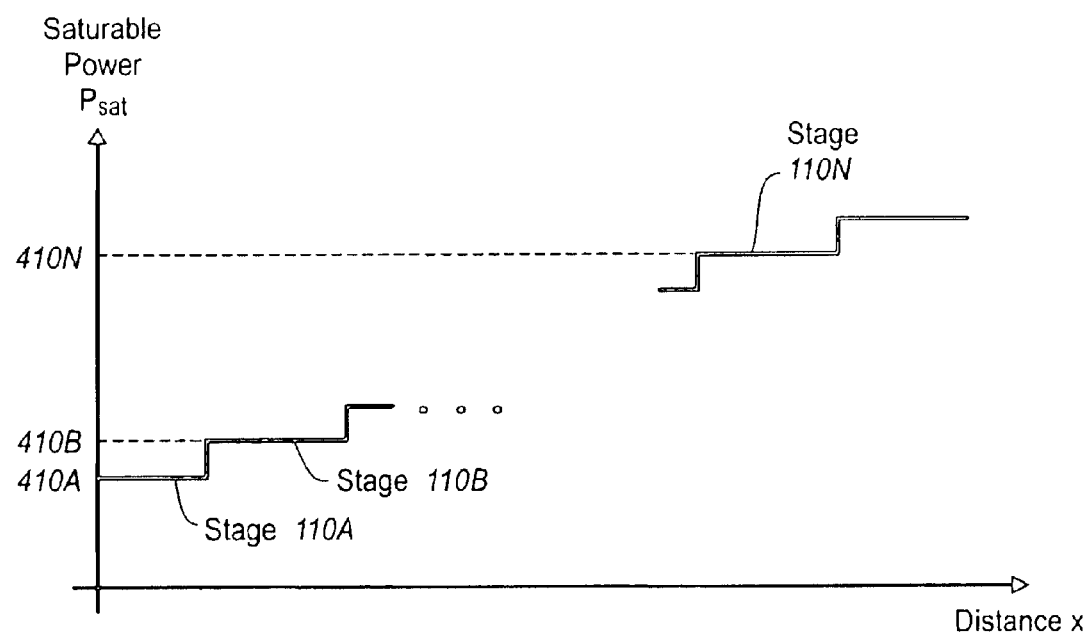
FIG. 4C is a graph of saturable power along the amplifying path for the same preferred embodiment.

FIGS. 4A–4C are graphs illustrating a preferred embodiment of multi-stage SOA 100 which overcomes this inherent tradeoff. In each of these figures, the independent variable x is the distance along the amplifying path through the multi-stage SOA 100. In this embodiment, N is a design parameter of each SOA stage 110 and each stage 110 is designed to have a successively lower value of N as shown in FIG. 4A. As a result, successive SOA stages have increasingly worse noise performance, as shown in FIG. 4B, but increasingly higher saturable power, as shown in FIG. 4C. The first SOA stage 110A has the highest value of N, resulting in the best noise performance 410A but the lowest saturable power 420A. The low saturable power, however, is not detrimental because the first SOA stage 110A is early in the amplification chain so the optical signal output by this stage 110A does not require a high saturable power. Conversely, the good noise performance is a distinct advantage since noise introduced in this early SOA stage 110A will be amplified by later stages 110B–110N. Similarly, the last SOA stage 110N has the lowest N, resulting in the worst noise performance 410N and the highest saturable power 420N. For the last stage 110N, the poor noise performance is less of a concern since there are no subsequent stages to amplify the noise introduced in this stage 110N. The high saturable power, however, is a distinct advantage since the last stage 110N outputs the highest power optical signal.

By comparison, a single stage SOA would require the N of the last stage 110N in order to achieve the same saturable power 420N (or the same overall gain assuming the incoming optical signals were of the same strength) as the multi-stage SOA 100. However, this choice of N would result in the noise figure 410N over the entire amplifying path, resulting in worse noise performance. In other words, the preferred embodiment of FIGS. 4A–4C can achieve both good noise performance and high output power compared to the single stage SOA (or a multi-stage SOA in which all the stages are identical).

The design parameter N of the various SOA stages 110 may be selected in a variety of ways. In a preferred approach, the first SOA stage 110A is designed to maximize the value of N in order to optimize the noise performance 410A of this stage. For a given design for the first SOA stage 110A, fixing the value of N also fixes the saturable power 420A, thus determining the maximum power which may be output by the first SOA stage 110A. The amplitude of the incoming signal is typically determined by the application for which the SOA stage 110A is intended. The length of the first SOA stage 110A is selected so that the maximum overall gain can be achieved by the low-noise first SOA stage 110A but ensuring that, after amplification, the incoming signal does not exceed the saturable power for the stage. The carrier density N for the last stage 110N is selected so that the saturable power 420N meets the output power requirement for the overall multi-stage SOA. The low value of N, however, will lead to poor noise performance in this last stage 110N. Therefore, it is desirable to limit the length (and overall gain) of this last stage. Intermediate stages are selected to fill in the gap in the amplification chain between the first stage 110A and last stage 110N.

As a numerical example, consider a multi-stage SOA 100 which is designed for a 30 dB gain (i.e., ×1000 amplification) and a 50 mW output. This means that the incoming optical signal will have a power of 50 □W or below. The first SOA stage 110A is selected to have a high value of N, say N=3 $N_0$. The value of N is typically limited by considerations such as thermal effects. The resulting noise figure is NF=2 N/(N−$N_0$)=3 and assume that the corresponding saturable power is 1 mW. To stay within the 1 mW saturable power limit for the first SOA stage 110A, the incoming 50 □W optical signal cannot be amplified by more than ×20. To be conservative, the length of the first SOA stage 110A is selected so that the overall gain is ×10, or 10 dB, resulting in a maximum output power for the first SOA stage 110A of 0.5 mW. For the last SOA stage 110N, assume that a saturable power of 50 mW may be achieved with a value of N=1.3 $N_0$, with a resulting noise figure of approximately NF=9. In order to limit the impact of the poor noise figure, the gain of the last stage 110N is limited to 5 dB, or ×3. The intermediate stage(s) must then amplify a 0.5 mW input into a 17 mW output, for an overall gain of 15 dB or ×30. This may be achieved in multiple stages (e.g., three stages of 5 dB each), but for simplicity assume a single intermediate stage. Further assume that N=1.7 $N_0$ is required to achieve the 17 mW output. The resulting noise figure for this stage would then be approximately NF=5. The overall noise figure for the multi-stage SOA may be approximated by the Friis equation:

$$NF=NF_1+(NF_2-2)/(G_1)+(NF_3-2)/(G_1*G_2)+ \qquad \text{(Eqn. 1)}$$

where NF is the overall noise figure for the multi-stage SOA, $NF_x$ is the noise figure for stage x (stage 1 being the first stage), and $G_x$ is the gain for stage x. Applying this equation yields NF=3+(5−2)/10+(9−2)/(10*30)=3.5 for the above example. By comparison, a single stage SOA with the same 30 dB gain and 50 mW output power would require N=1.3 $N_0$ for the entire length of the device, resulting in an overall noise figure of NF=9, significantly higher than the multi-stage SOA value of NF=3.5.

The preferred embodiment described above has been described with respect to variations in the carrier density N. However, it will be apparent that these variations can be achieved using a number of other design parameters. For example, N is the carrier density at the lasing threshold. That is, N is the carrier density necessary to achieve the gain required to offset round-trip losses in the laser cavity 140. Hence, if the losses are increased, then the required gain will also increase, resulting in a higher N. Losses may be due to a variety of factors, including the reflectivity of the mirrors forming the laser cavity, diffraction losses, losses due to scattering, and absorption losses; and various design parameters may be varied to affect these losses. Alternately, changes in the laser cavity design may also be used to affect N. For example, increasing the round-trip optical path length in the laser cavity, while keeping all losses the same, will decrease N. As a final example, non-lasing SOAs may be appropriate for the early, low-power stages 110 since the power requirements for these early stages may be low enough to avoid the problematic gain saturation effects characteristic of non-lasing SOAs. FIGS. 5–8 illustrate some examples in accordance with the present invention. FIG. 5B shall be discussed in greater detail and depth and generally shows greater detail than the other figures, but it is to be understood that the principles discussed with respect to FIG. 5B also apply to the remaining figures.

Figure 5A:
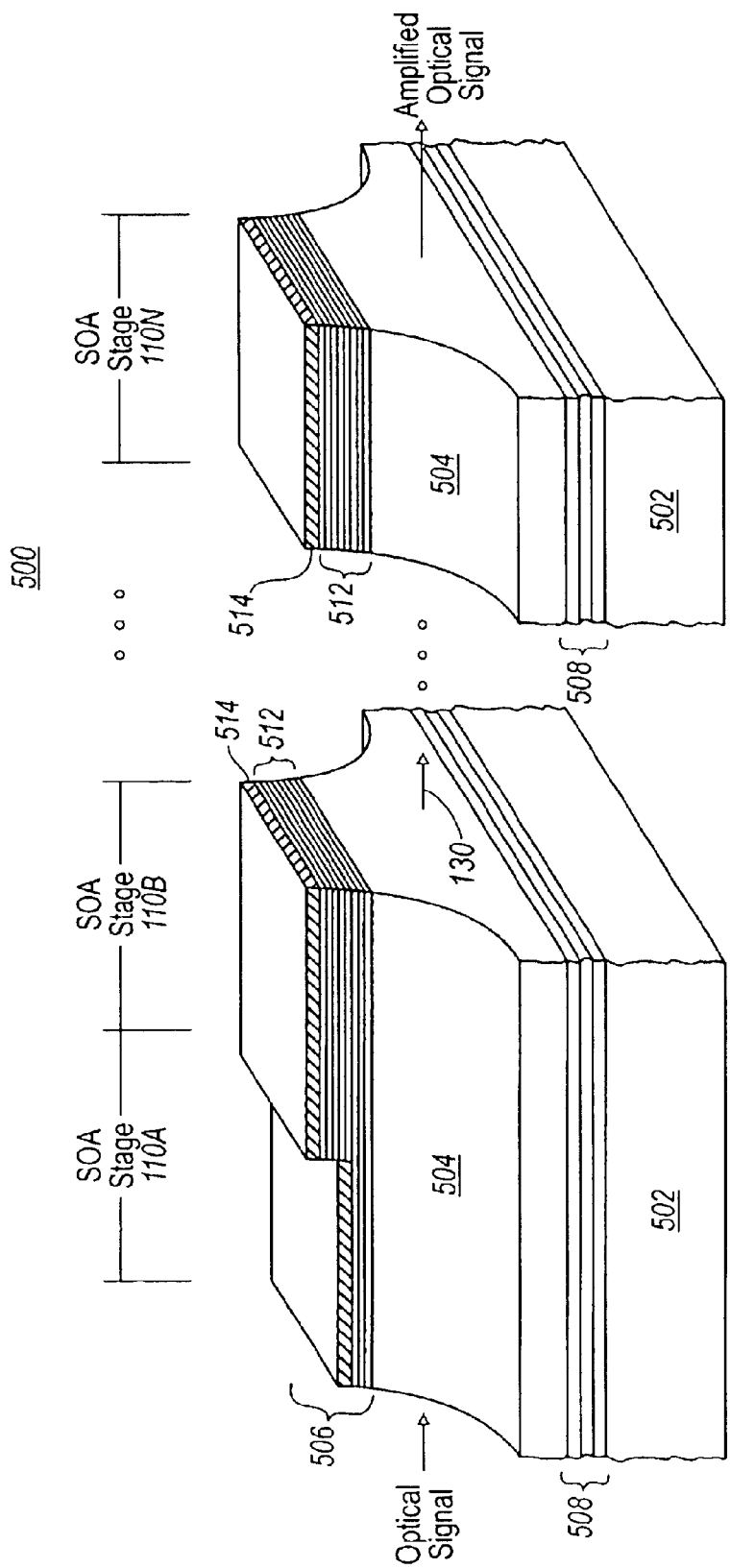
FIG. 5A is a perspective view of a multi-stage, vertically lasing semiconductor optical amplifier (VLSOA) 500 utilizing mirrors of varying reflectivity according to a preferred embodiment of SOA 100.
Figure 5B:
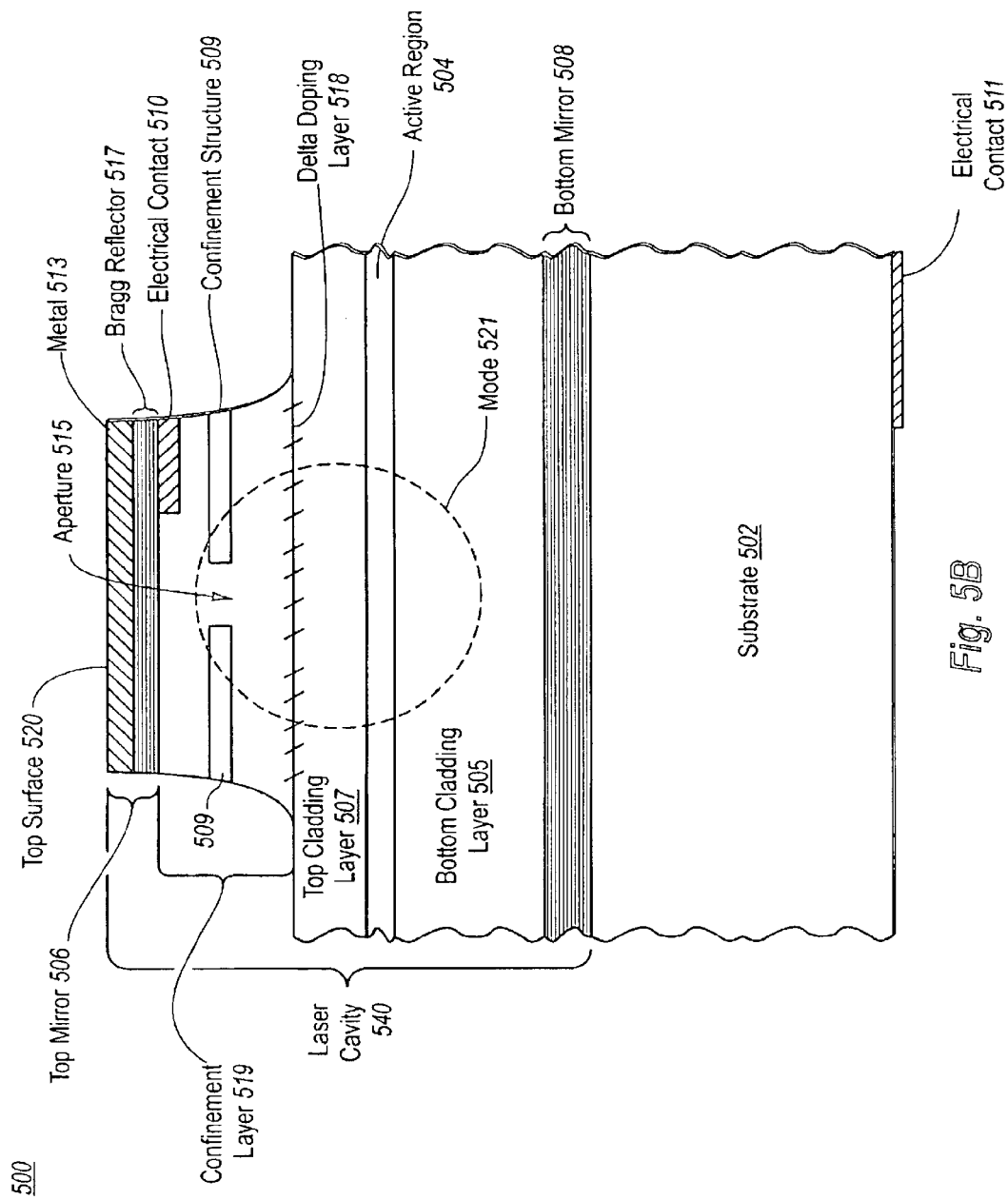
FIG. 5B is a transverse cross-sectional view of VLSOA 500.
Figure 5C:
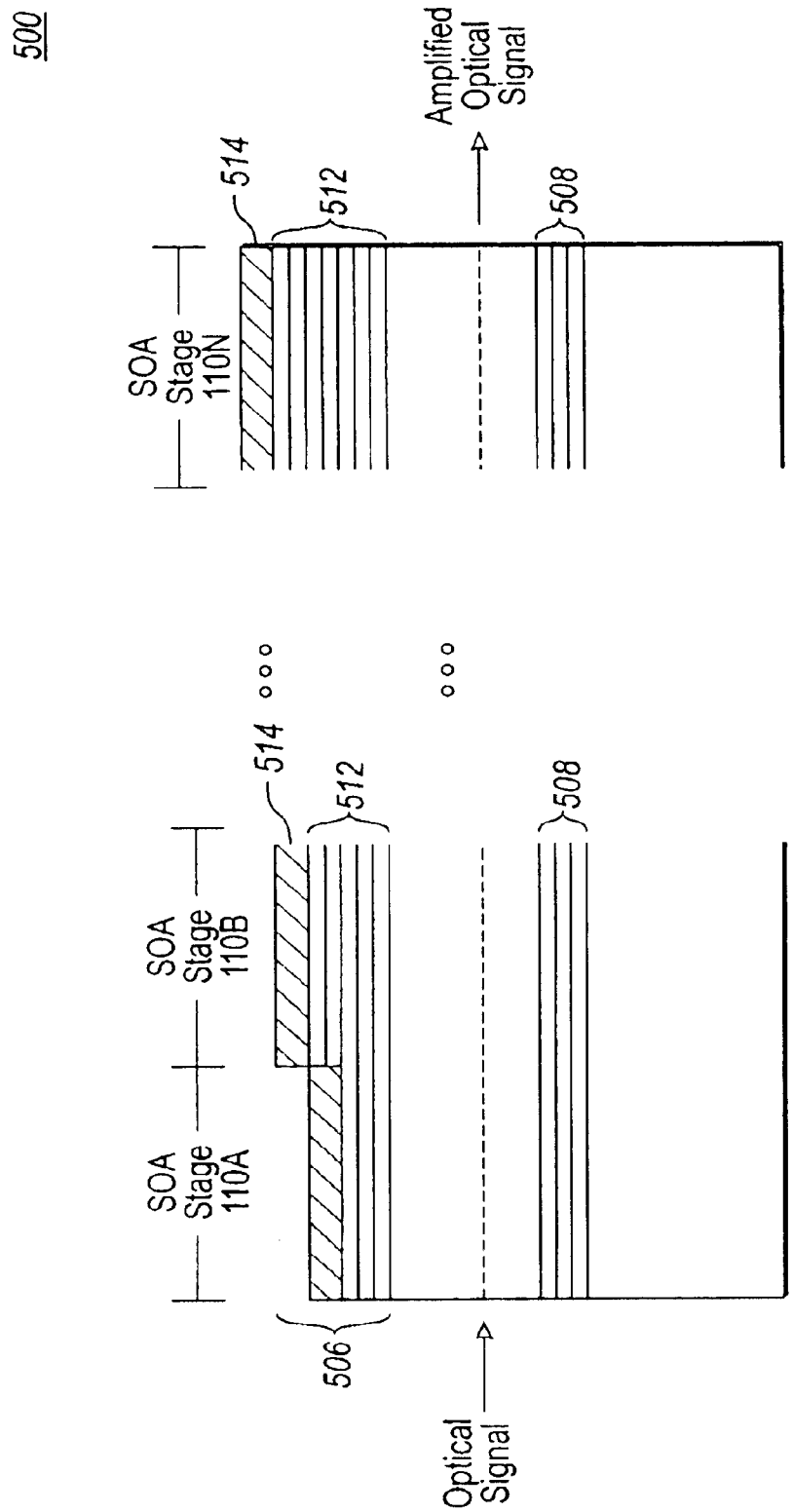
FIG. 5C is a longitudinal cross-sectional view of VLSOA 500.

FIGS. 5A–5C are a perspective view, transverse cross-section, and longitudinal cross-section, respectively, of a preferred embodiment of multi-stage SOA 100, with FIG. 5B showing the most detail. This embodiment is a vertical lasing semiconductor optical amplifier (VLSOA) 500, meaning that the laser cavity 140 is oriented vertically with respect to the amplifying path 130. The VLSOA 500 is long in the longitudinal direction, allowing for a long amplifying path 130 and, therefore, more amplification. The SOA stages 110 are contiguous to each other (see FIG. 5C) and the entire VLSOA 500 is an integral structure formed on a single substrate 502. This allows all of the SOA stages 110 to be fabricated simultaneously using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

Since the SOA stages 110 are contiguous, the inputs 112 and outputs 114 between stages 110 correspond to the boundaries between the SOA stages 110 but there are no separate physical structures which correspond to these inputs 112 and outputs 114. For example, a single integral semiconductor gain medium 120 (i.e. 504) is used for all SOA stages 110 and each SOA stage 110 simply utilizes a different section of the semiconductor gain medium, as shown in FIG. 5C. The semiconductor gain media for the different SOA stages 110 are not physically separated into distinct pieces in this embodiment.

Referring to FIG. 5B and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

Comparing to FIG. 1, the semiconductor gain medium 120 includes the active region 504 and the laser cavity 140 is formed primarily by the two mirrors 506 and 508 and the active region 504. This embodiment is electrically pumped so the pump input 150 includes the electrical contacts 510 and 511.

VLSOA 500 is a vertical lasing semiconductor optical amplifier since the laser cavity 140 is a vertical laser cavity. That is, it is oriented vertically with respect to the amplifying path 130 and substrate 502. The VLSOA 500 preferably is long in the longitudinal direction, allowing for a long amplifying path 130 and, therefore, more amplification. The entire VLSOA 500 is an integral structure formed on a single substrate 502 and may be integrated with other optical elements. In most cases, optical elements which are coupled directly to VLSOA 500 will be coupled to the amplifying path 130 within the VLSOA. Depending on the manner of integration, the optical input 512 and output 514 may not exist as a distinct structure or facet but may simply be the boundary between the VLSOA 500 and other optical elements. Furthermore, although this disclosure discusses the VLSOA 500 primarily as a single device, the teachings herein apply equally to arrays of devices.

VLSOA 500 is a layered structure, allowing the VLSOA 500 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505 and 507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 130 is through the active region 504 in the direction in/out of the plane of the paper with respect to FIG. 5B.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In a preferred embodiment, the VLSOA 500 is optimized for the 1.55 micron window.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and non-Bragg reflectors such as metallic mirrors. Bottom mirror 508 in FIG. 5 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 510 and 511 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 510 and 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 5, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 140 is determined in part by aperture 515. In other words, the confinement structure 509 provides lateral confinement of the optical mode of laser cavity 140. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current.

The integration of VLSOAs with other optical elements may be implemented using any number of techniques. In one approach, both the VLSOA and the other optical element are formed using a common fabrication process on a common substrate, but with at least one parameter varying between the VLSOA and the optical element. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface, This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first substrate. The optical element is formed on a second substrate. The VLSOA and the optical element are then integrated onto a common substrate, which could be the first substrate, the second substrate or a completely different substrate.

Referring again to FIG. 1, SOA stages 110 differ in that the round-trip reflectivity of the top and bottom mirrors 506 and 508 differ from stage to stage. In particular, the mirrors 506,508 of the first SOA stage 110A have the lowest round-trip reflectivity and the mirrors 506,508 of each subsequent SOA stage 110 have an increasingly higher round-trip reflectivity. In the previously described embodiment which uses hybrid Bragg/metal mirrors 506, the number of layers in the Bragg portion of the top mirror 506 increases from stage 110A to stage 110N, thus increasing the reflectivity of the top mirror 506. As the mirror reflectivity increases from stage to stage, this means that the round-trip losses for the laser cavities 140 decrease from stage to stage. This, in turn, means that the round-trip gain required to reach the lasing threshold decreases from stage to stage and that the carrier density N at the lasing threshold also decreases from stage to stage. This is precisely the situation depicted in FIGS. 4A–4C and VLSOA 500 functions as described with respect to FIGS. 4A–4C.

More specifically, referring again to FIG. 2, each SOA stage 110 of VLSOA 500 operates as follows. The active region 504 is pumped 230 so that the carrier density in the semiconductor gain material 120 increases. The pumping is performed at a sufficiently high level such that a lasing threshold of a mode of the vertical cavity 140 is exceeded and laser radiation is generated by the vertical cavity 140. This laser radiation may be emitted from the vertical cavity, for example, through the top surface 520 or into the substrate 502 or it may be generated but not actually emitted from the stage 110. The laser radiation may lie in the visible light range, infrared range, ultraviolet range, or any other frequency range.

While the laser cavity 140 is operating above the lasing threshold, an optical signal received from the previous SOA stage 110 propagates 220 along the amplifying path 130 for the current SOA stage 110. As the optical signal propagates 220 through the active region 504, the optical signal is amplified 240 by a gain multiplier due to stimulated emission of additional photons. The gain multiplier is substantially constant (i.e., independent of the amplitude of the optical signal) because the laser radiation produced by laser cavity 140 acts as a ballast to prevent gain saturation. When the optical signal is weaker, less additional photons are stimulated by the optical signal, but more laser radiation is generated. When the optical signal is stronger, more additional photons are stimulated by the optical signal, but less laser radiation is generated. Typically, the value of the constant gain multiplier is inversely proportional to the loss of the cavity mirrors 506 and 508. For example, if a 0.2% loss (99.8% reflectivity) results in a gain of 10 dB (10 times), then a three times larger 0.6% loss (99.4% reflectivity) would result in a three times larger logarithmic gain of 30 dB (1000 times) for otherwise identical stages 110.

Figure 6:
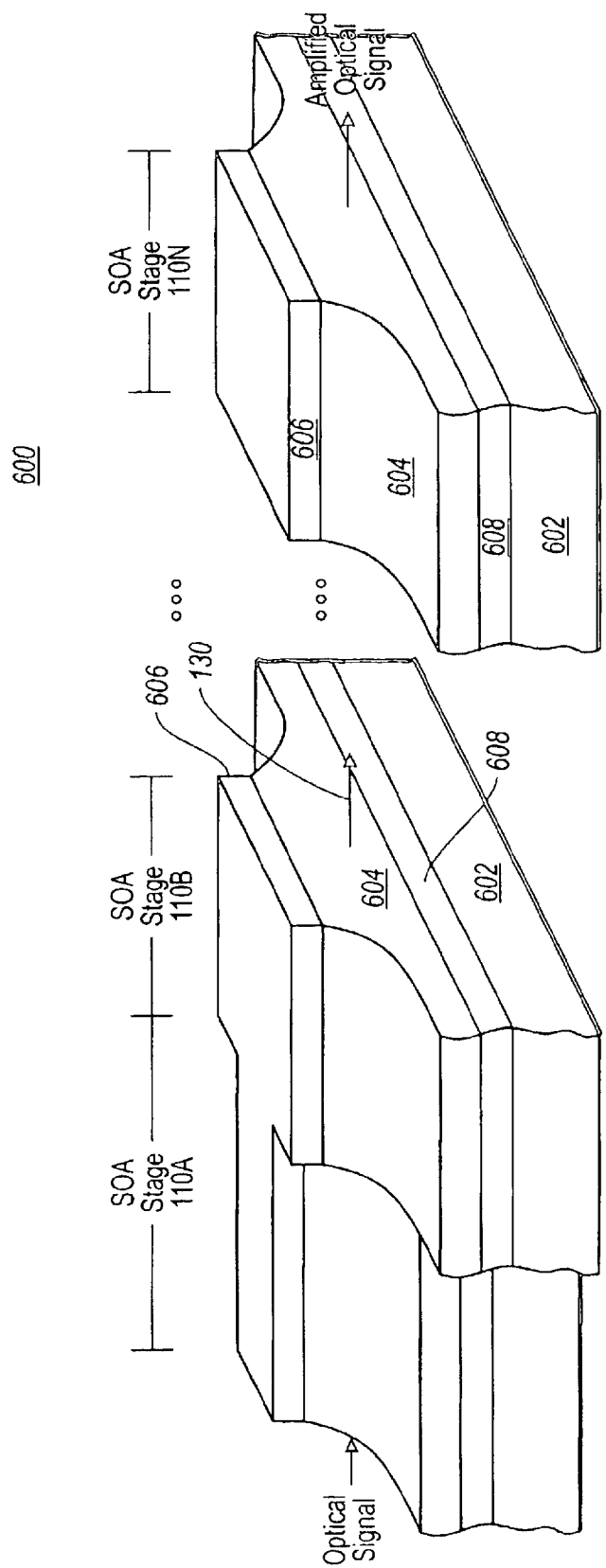
FIG. 6 is a perspective view of a multi-stage VLSOA 600 of varying width according to another embodiment of SOA 100.

FIG. 6 is a perspective view of a multi-stage VLSOA 600 of varying width according to another embodiment of SOA 100. VLSOA 600 is similar to VLSOA 500 with components 602–608 corresponding to components 502–508 of VLSOA 500, but with the following differences. First, the reflectivity of mirrors 506,508 of VLSOA 500 varied from stage to stage; whereas they do not in VLSOA 600. Second, the width of each SOA stage 110 of VLSOA 500 was constant; whereas each SOA stage 110 of VLSOA 600 becomes progressively wider. In particular, the first SOA stage 110A (and the effective cross-section of laser cavity 140A) is the narrowest while the effective cross-section of the laser cavity 140 of each subsequent SOA stage 110 is increasingly wider. This means that the round-trip diffraction losses for the laser cavities 140 decrease from stage to stage. This, in turn, means that the round-trip gain required to reach the lasing threshold decreases from stage to stage and that the carrier density N during lasing also decreases from stage to stage. This is again the situation depicted in FIGS. 4A–4C and VLSOA 600 functions as described with respect to FIGS. 4A–4C. As explained previously, the later stages 110 of VLSOA 600 are able to support higher output powers because the saturable power increases with the decreasing carrier density N. The increasing width also results in higher output powers because later stages are simply larger in cross-sectional area. In an alternate embodiment, the physical width of each SOA stage 110 is constant from stage to stage, but the size of aperture 515 increases from stage to stage, thus increasing the effective cross-section of each laser cavity 140.

FIGS. 5 and 6 depict two embodiments in accordance with the preferred embodiment of FIGS. 4A–4C. Other embodiments will be apparent. For example, any approaches for varying the round-trip losses in the laser cavity 140 will also result in variations of the carrier density N at the lasing threshold and, therefore, can be used to implement the preferred embodiment of FIGS. 4A–4C. For example, referring again to FIG. 5B, the reflectivity of either top mirror 506 or bottom mirror 508 may be adjusted by ion implantation, by temperature adjustment, by an applied voltage, by mechanical deformation of the mirror, by tilting the mirror, by horizontally displacing the mirror, or by some other mechanism. As another example, an absorptive layer, such as a liquid crystal layer, may be introduced into the laser cavity 140, with the absorption varying from stage to stage; or ion implantation may be used to adjust the absorption or scattering within the laser cavity 140. Alternately, aperture 515 may be moved in the vertical direction to vary the amount of aperturing or scattering introduced. For example, if aperture 515 is located at a null of the dominant mode for laser cavity 140, its effect will be minimized, whereas placing aperture 515 at an anti-null will maximize its effect. These techniques may also be used in combination. Furthermore, the adjustment mechanism may be dynamically adjustable, thus allowing for real-time adjustment of SOA 100.

Figure 7:
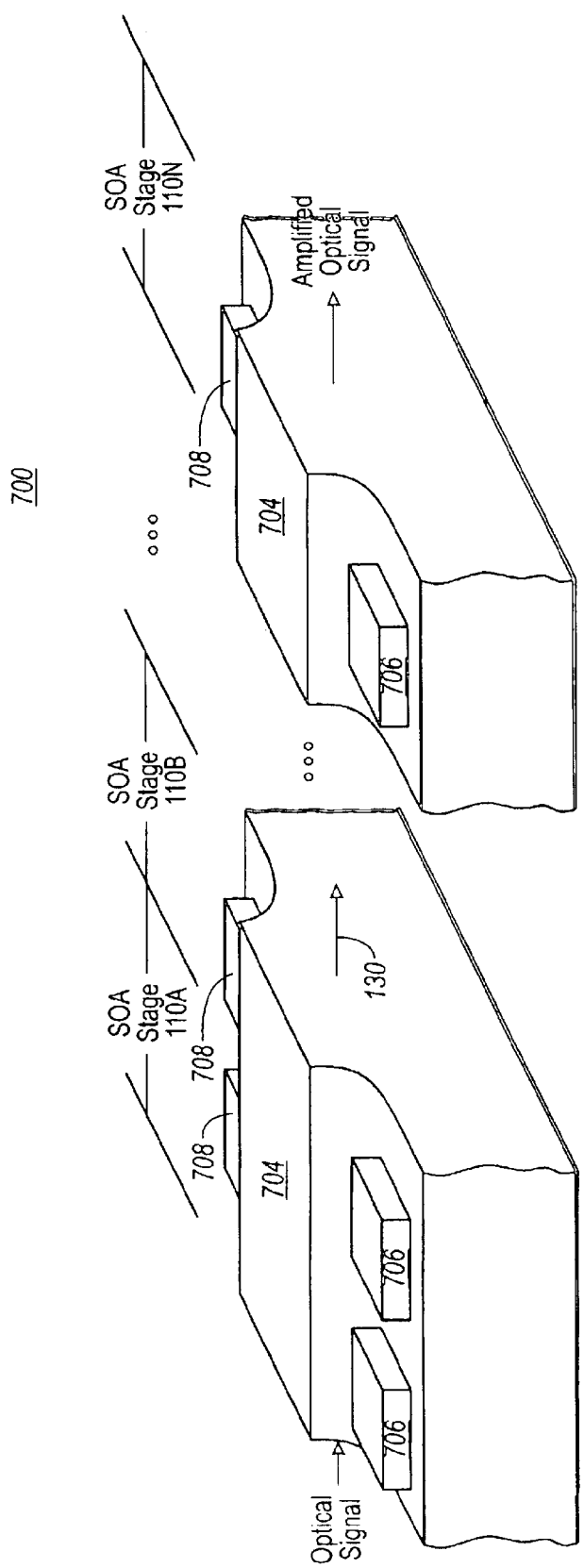
FIG. 7 is a perspective view of a multi-stage transverse lasing semiconductor optical amplifier (TLSOA) 700 according to an embodiment of SOA 100.

FIG. 7 is a perspective view of a multi-stage transverse lasing semiconductor optical amplifier (TLSOA) according to an embodiment of SOA 100. In the multi-stage TLSOA 700, each SOA stage 110 includes a laser cavity 140 oriented transversely with respect to the amplifying path 130. The laser cavity 140 includes an active region 704 disposed between a right cavity mirror 706 and a left cavity mirror 708. The active region 704 is pumped such that a lasing threshold of the transverse cavity 140 is surpassed. As a result, the laser cavity 140 generates laser radiation and clamps the gain of the active region 704 to a value which is essentially constant. The optical signal propagating along the amplifying path 130 is amplified as its passes through the active region 704.

The SOA stages 110 of TLSOA 700 differ in that the mirror reflectivity increases from stage 110A to stage 110N. As a result, the carrier density N at the lasing threshold decreases from stage 110A to stage 110N, which is the situation depicted in FIGS. 4A–4C and TLSOA 700 functions as described with respect to FIGS. 4A–4C. The multi-stage TLSOA 700 in FIG. 7 is analogous to the multi-stage VLSOA 500 in FIG. 5, and the previous description of alternate embodiments for VLSOA 500 (and 600) also applies to TLSOA 700.

Figure 8:
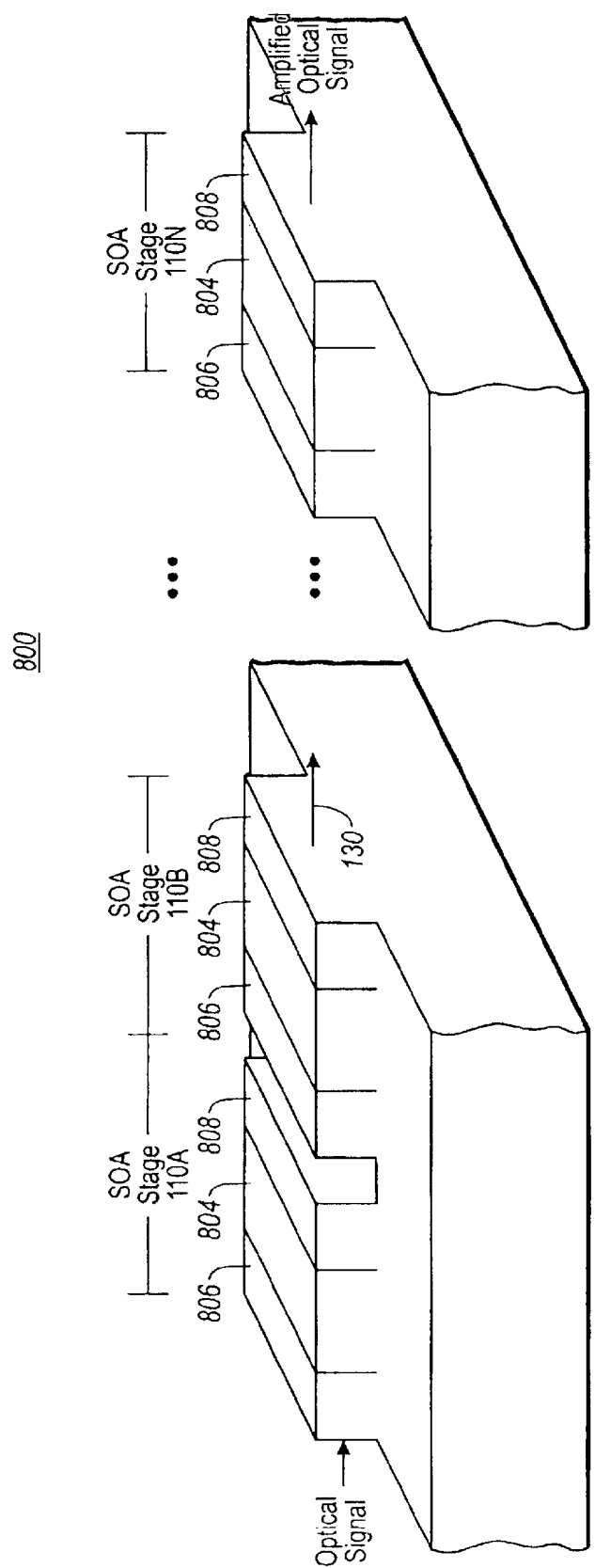
FIG. 8 is a perspective view of a multi-stage longitudinally lasing semiconductor optical amplifier (LLSOA) 800 according to an embodiment of SOA 100.

FIG. 8 is a perspective view of a multi-stage longitudinally lasing semiconductor optical amplifier (LLSOA) 800 according to an embodiment of SOA 100. In the multi-stage LLSOA 800, each SOA stage 110 includes a laser cavity 140 oriented longitudinally with respect to the amplifying path 130. In other words, unlike the VLSOA and TLSOA designs, the laser cavity in LLSOA 800 is not off-axis with respect to the amplifying path. Rather, the laser cavity is aligned with the amplifying path 130. The laser cavity 140 includes an active region 804 disposed between a first cavity mirror 806 and a second cavity mirror 808. The active region 804 is pumped such that a lasing threshold of the longitudinal cavity 140 is surpassed. As a result, the laser cavity 140 generates laser radiation and clamps the gain of the active region 804 to a value which is essentially constant. The optical signal propagating along the amplifying path 130 is amplified as its passes through the active region 804.

As with VLSOA 500 and TLSOA 700, the SOA stages 110 of LLSOA 800 differ in that the mirror reflectivity increases from stage 110A to stage 110N and LLSOA 800 functions as described with respect to FIGS. 4A–4C. The mirror reflectivity for LLSOA 800, however, is typically much lower than those for VLSOA 500 and TLSOA 700 due to the longitudinal design. Values of 1–20% reflectivity are typical for LLSOA 800, as compared to 95–100% for VLSOA 500 and TLSOA 700. In addition, the mirrors 806,808 for LLSOA 800 typically must be more wavelength selective so that, for example, the optical signal to be amplified is not reflected by the mirrors 806,808 and so only makes a single pass through LLSOA 800. Again, alternate embodiments will be apparent, as discussed previously with respect to for VLSOAs 500 and 600 and TLSOA 700

As another alternative to the embodiments shown in FIGS. 1–8, the various SOA stages 110 may be optically isolated from each other in order to prevent propagation of signals, including amplified spontaneous emission, in the reverse direction (i.e., from stage 110N to 110A). For example, without such isolators, signals generated in any SOA stage 110 may propagate backwards to earlier SOA stages 110, being amplified along the way. When the amplified signal reaches the earlier SOA stage 110, which is designed for lower power in the preferred embodiment of FIG. 4, the unwanted signal may exceed the saturable power limit for that stage and thus prevent the stage from operating correctly. Even if it does not exceed the saturable power limit, the unwanted signal will degrade the performance of the earlier stage 110 since some of the output power budget for that stage will be used by the unwanted signal rather than directed toward amplifying the desired signal. Optical isolators which prevent or reduce this backwards propagation will alleviate this problem. For example, each SOA stage 110 may be implemented on a separate chip, with bulk isolators inserted between the chips. Alternately, the isolators may be integrated with the SOA stages 110 or the SOA stages 110 themselves may be designed to minimize this effect.

Figure 9:
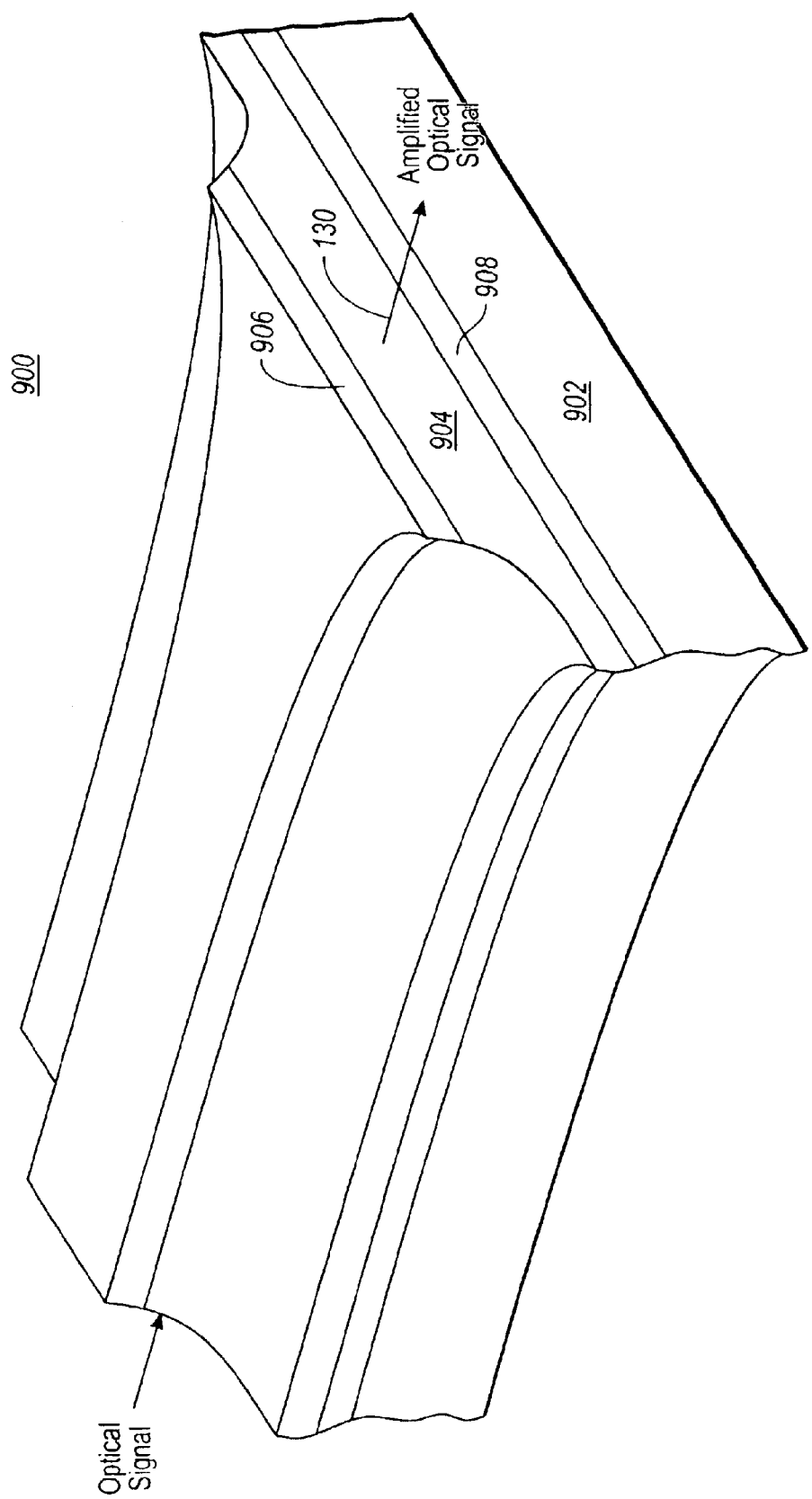
FIG. 9 is a perspective view of a continuously flared VLSOA 900 in accordance with the present invention.

FIGS. 1–8 describe SOAs which consist of a number of discrete stages, with a design parameter varying from stage to stage. In alternate embodiments, the design parameter of the laser cavity varies continuously along the amplifying path rather than discretely in stages. For example, FIG. 9 is a perspective view of a continuously flared VLSOA 900 in accordance with the present invention. This is a variation of multi-stage VLSOA 600, with components 902–908 of VLSOA 900 corresponding to components 602–608 of VLSOA 600. However, rather than having separates SOA stages 110, each of which becomes progressively wider as in VLSOA 600, VLSOA 900 gradually becomes wider as the optical signal propagates from input to output. Alternately, VLSOA 900 may be thought of as a version of VLSOA 600 in which there are an infinite number of infinitesimally thin SOA stages 110. Each point along the amplifying path 130 may then be characterized by the design parameter, which varies along the amplifying path. For example, the increasing width of VLSOA 900 means that the diffraction loss decreases, the carrier density N decreases, the noise figure increases, and the saturable power increases along the amplifying path 130. In addition, the gradual increase in width typically is advantageous for changing the width of a single mode optical signal. The taper typically is less likely to excite secondary modes or to result in unwanted intensity fluctuations (e.g., filamentation). In contrast, the multi-stage design 600 is more likely to excite secondary modes due to the abrupt changes in width and increased scattering at these boundaries. The tapering also favors forward propagation over backward propagation, thus providing a limited amount of isolation in the backward direction. This concept of continuous variation along the amplifying path, rather than discretely in stages, may also be applied to the other SOAs described above.

Figure 17:
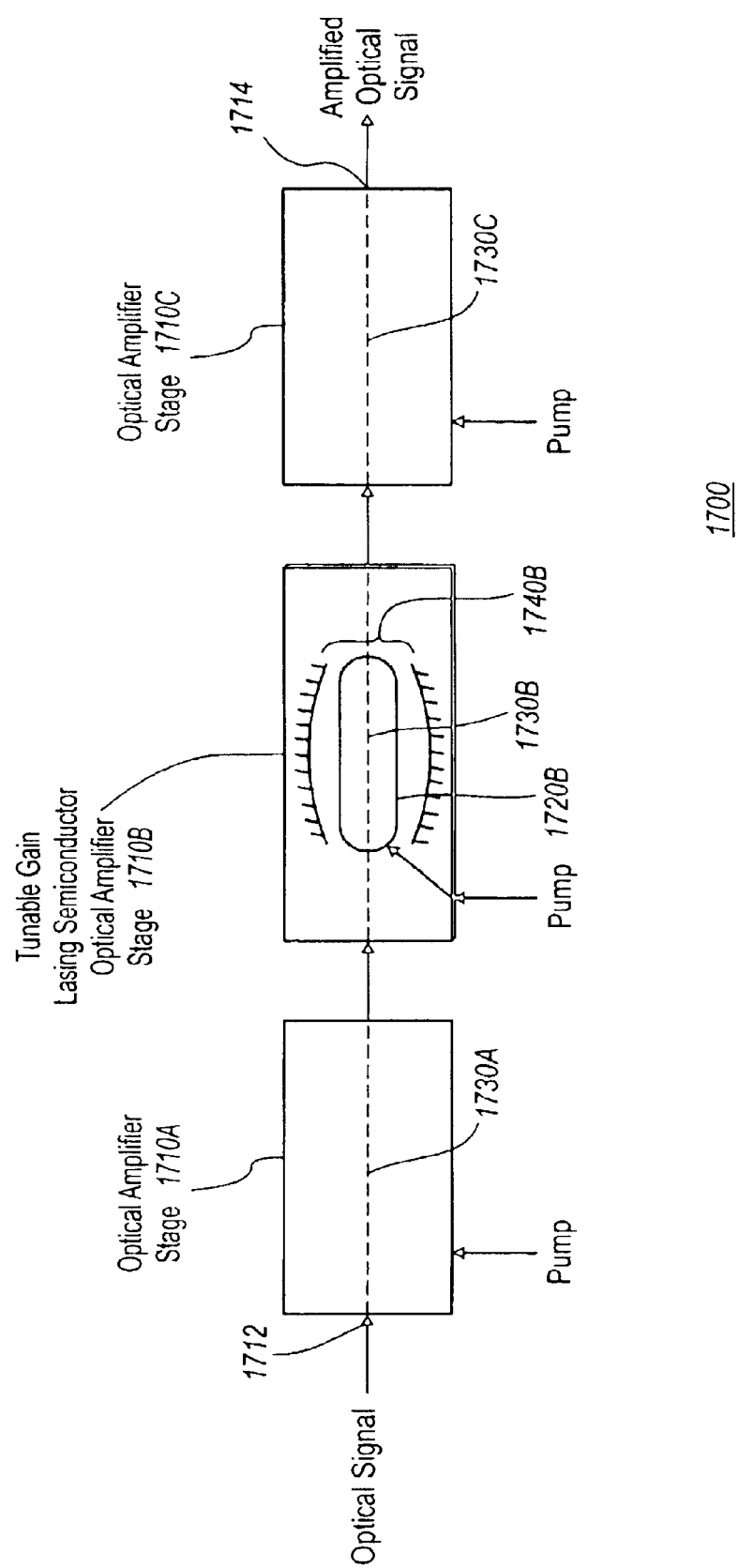
FIG. 17 is a diagram of a multi-stage tunable gain optical amplifier (MTOA) 1700 in accordance with the present invention.

A preferred embodiment of the present invention is illustrated in FIG. 17. FIG. 17 is a diagram of a multi-stage tunable gain optical amplifier (MTOA) 1700 in accordance with the present invention. In this embodiment, MTOA 1700 includes three stages, two optical amplifier stages 1710A and 1710C and a tunable gain optical amplifier stage 1710B (collectively, amplifier stages 1710). Each amplifier stage has an input 1712 and an output 1714 and the amplifier stages 1710 are coupled in series, with the output of each amplifier stage 1710 coupled to the input of the next amplifier stage 1710. Each amplifier stage 1710 includes an amplifying path 1730 coupled between the input 1712 and the output 1714 of the amplifier stage 1710. Optical amplifier stage 1710B is capable of tuning the gain of stage 1710B, whereas optical amplifier stages 1710A and 1710C are not tunable.

Figure 18:
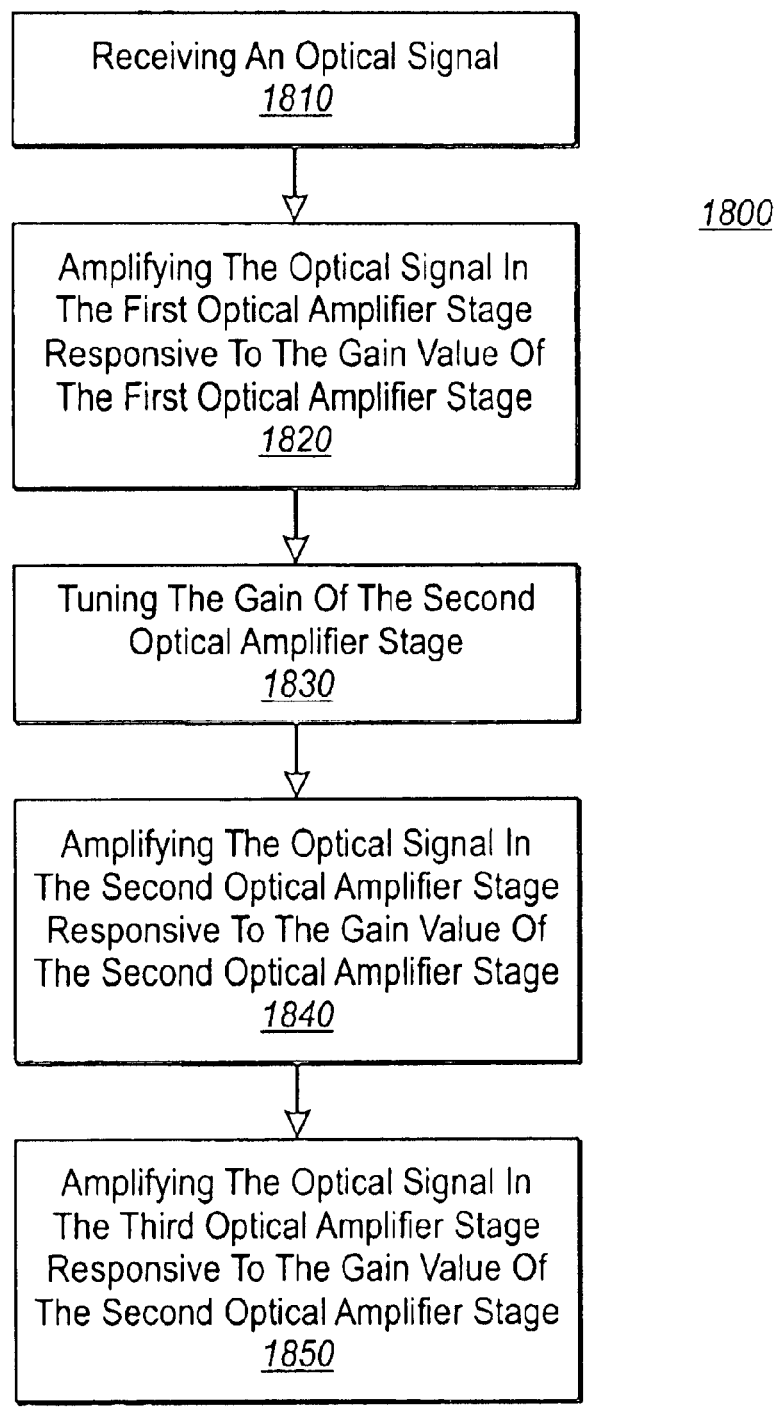
FIG. 18 is a flow diagram illustrating operation of MTOA 1700.

FIG. 18 is a flow diagram 1800 illustrating operation of MTOA 1700 in more detail. MTOA 1700 receives 1810 an optical signal at optical amplifier stage 1710A and amplifies 1820 the optical signal according to a constant gain value associated with amplifier stage 1710A. In step 1830, the gain value associated with the tunable gain optical amplifier stage 1710B is tuned 1830, for example, in order to obtain a specific overall gain value for MTOA 1700. The optical signal passes from amplifier stage 1710A to the tunable gain optical amplifier stage 1710B were the optical signal is amplified 1840 according to the tuned gain value. The optical signal passes into optical amplifier stage 1710C which also amplifies 1850 the optical signal according to a constant gain value. By including the tunable gain amplifier stage 1710B, the overall gain of MTOA 1700 can be tuned by adjusting the gain value in the tunable gain amplifier stage 1710B.

In a preferred embodiment, optical amplifier stage 1710A is designed so that it has better noise performance (i.e. lower noise figure) than tunable gain amplifier stage 1710B. The low-noise performance is beneficial in this stage of the amplifier because any noise introduced at this stage will be amplified by the later stages. In order to obtain low noise performance, the gain value associated with stage 1710A is usually small. This type of optical amplifier stage 1710A is often referred to as the pre-amplification (or pre-amp) stage. In addition, optical amplifier stage 1710C is designed so that it has a high output power. As described above, this means that stage 1710 likely will also have a high noise figure (i.e. poor noise performance). However, the poor noise performance in optical amplifier stage 1710C is less of a concern since there are no subsequent stages to amplify the noise introduced in this stage. The high output power (e.g. high saturable power in the case of a VLSOA), however, is a distinct advantage since the optical amplifier stage 1710C outputs a high power optical signal. Thus, this type of optical amplifier stage 1710C is also referred to as an optical power booster (or booster) stage.

In the embodiment described above, there are three stages in the multi-stage optical amplifier. However, other embodiments are possible. For example, in one alternate embodiment, optical amplifier stage 1710A and tunable gain amplifier stage 1710B are coupled in series but without the third stage 1710C. In this embodiment, stage 1710A is designed for good noise performance and stage 1710B is designed to provide a high output power in addition to the tunable gain. In another embodiment, tunable gain amplifier stage 1710B is coupled to optical amplifier stage 1710C but without first stage 1710A. In this embodiment, stage 1710B provides the tunable gain and stage 1710C is designed to produce a high output power. In addition to the two and three stage approaches described above, any number of stages could be used to construct a multi-stage tunable gain optical amplifier, as described throughout this disclosure.

In a preferred embodiment, optical amplifier stages 1710A and 1710C are vertical lasing semiconductor optical amplifiers (VLSOAs) and the tunable gain amplifier stage 1710B is a tunable gain VLSOA as described below. However, other optical amplifiers could be used in stages 1710A, 1710B and 1710C. For example, optical amplifier stages 1710A and 1710C could be constructed using longitudinal lasing semiconductor optical amplifiers, transverse lasing semiconductor optical amplifiers, non-lasing semiconductor optical amplifiers, erbium doped fiber amplifiers, etc. Also, tunable gain amplifier stage 1710B could be constructed using a tunable gain longitudinal lasing semiconductor optical amplifier (described herein), a tunable gain transverse lasing semiconductor optical amplifier (described herein), a non-lasing semiconductor optical amplifier used in combination with a tunable loss element (such as a Variable Optical Attenuator (VOA)) or an erbium doped fiber amplifier used in combination with a tunable loss element.

In another embodiment, the multi-stage tunable gain optical amplifier is a continuously flared VLSOA similar to that illustrated in FIG. 9 with the middle portion of the continuously flared VLSOA implemented as a tunable gain VLSOA. In this embodiment, the stages are of varying widths. The first and last stages consist of fixed gain VLSOA optical amplifier stages and the middles stage consists of a tunable gain VLSOA optical amplifier stage. In yet another embodiment, one or more of the optical amplifiers stages of MTOA 1700 are continuously flared VLSOAs, such as that illustrated in FIG. 9. In another embodiment, the tunable gain optical amplifier stage comprises a continuously flared tunable gain VLSOA. Parameters other than the width can also be varied.

FIGS. 10–16 below illustrate various embodiments of tunable gain optical amplifiers that can be used in tunable gain amplifier stage 1710B of MTOA 1700.

Figure 10:
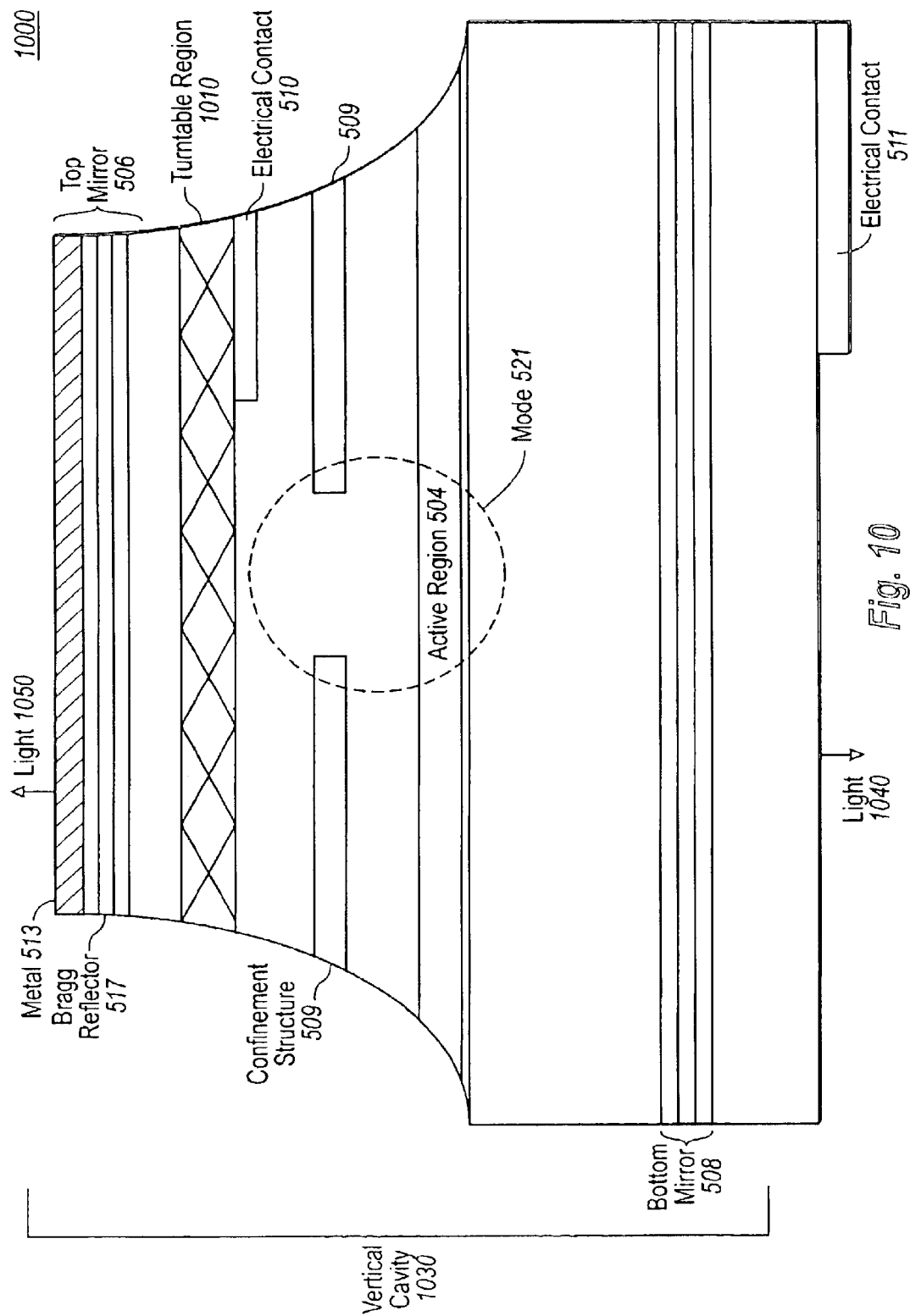
FIG. 10 is a cross-sectional diagram of a tunable-gain vertical-lasing semiconductor optical amplifier (VLSOA) 1000 which includes a tunable region 1010 between an active region 504 and a top cavity mirror 506 according to an embodiment of the present invention.
Figure 11:
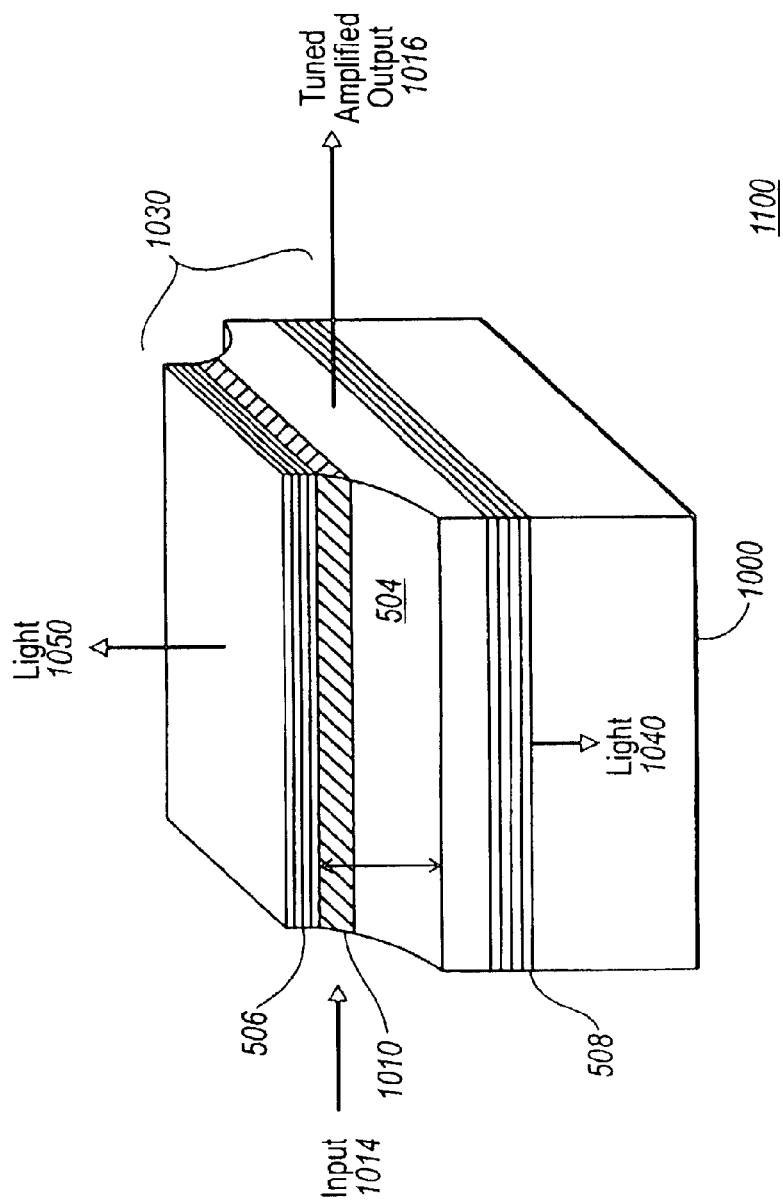
FIG. 11 is a perspective drawing of the tunable-gain VLSOA 1000 of FIG. 10.

FIG. 10 is a cross-sectional diagram of a tunable-gain vertical-lasing semiconductor optical amplifier (VLSOA) 1000. This cross-sectional diagram is similar to FIG. 5B but includes a tunable region 1010 between confinement structure 509 and top mirror 506. FIG. 11 is a perspective view of VLSOA 1000.

In this embodiment, the laser cavity is electrically pumped by injecting a pump current via the electrical contacts 510, 511 into the active region 504. In particular, contact 510 is a p-type contact to inject holes into active region 504, and contact 511 is an n-type contact to inject electrons into active region 504. The pumping is performed at a sufficiently high level such that a lasing threshold of the vertical cavity 1030 is exceeded and light 1050 and/or 1040 is output from the top surface and/or into the substrate respectively. The frequency the light 1050 and/or 1040 may lie in the visible light range, infrared range, ultraviolet range, or any other frequency range. Alternatively, the light 1050 and/or 1040 may be generated but not actually emitted from the amplifier.

While operating above the lasing threshold, an optical signal is input into the active region 504 in a direction generally perpendicular to the plane of FIG. 10. As the optical signal travels through the active region 504, the optical signal is amplified by a constant gain multiplier due to stimulated emission of additional photons. FIG. 11 shows the optical signal 1014 input into VLSOA 1000 and the amplified optical signal 1016 output from VLSOA 1000.

The gain multiplier is constant and independent of the dynamic strength of the optical signal because the laser light 1050 and/or 1040 acts as a ballast to prevent gain saturation. When the optical signal is weaker, less additional photons are stimulated by the optical signal, but more laser light 1050 and/or 1040 is generated. When the optical signal is stronger, more additional photons are stimulated by the optical signal, but less laser light 1050 and/or 1040 is generated.

The value of the gain multiplier is made tunable by the presence of a tunable loss layer 1010. In this embodiment, the tunable loss layer 1010 is placed between the active region 504 and the top mirror 506. In an alternate embodiment, the tunable loss layer 1010 is placed between the active region 504 and the bottom mirror 508. In another embodiment, tunable loss layer 1010 requires two or more contacts, one of which could be shared with contact 510. The tunable loss layer 1010 may be, for example, a liquid crystal layer whose transmittance is tuned by the application of a voltage across the layer. The lower the transmittance of the tunable loss layer 1010, the lower the "effective" reflectivity of the top mirror 506 and hence the higher the constant gain multiplier of the tunable-gain VLSOA 1000.

FIG. 12A is a cross-sectional diagram of a tunable-gain VLSOA 1200 which includes a tunable region 1010 between the bottom mirror 508 and an additional mirror 1210 according to a preferred embodiment of the present invention. The tunable region 1010 may be a liquid crystal layer or another adjustable loss layer. The additional mirror 1210 may be a Bragg reflector or another type of mirror.

In comparison to the tunable-gain VLSOA in FIG. 10, the tunable-gain VLSOA 1200 in FIG. 12A moves the tunable region 1010 outside of the vertical cavity 1030, sandwiching the tunable region 1010 between the bottom mirror 508 and an additional mirror 1210. By so moving the tunable region 1010, the need for extremely fine control of the tunable loss layer 1010 is avoided. The tunable region 1010 and the additional mirror 1210 may be integrated into the semiconductor device itself or, alternatively, may be external to the semiconductor device. For example, the additional mirror 1210 may be fabricated epitaxially to be part of the semiconductor device, or it may be positioned on the back surface of the semiconductor wafer.

The effective reflectivity of the bottom mirror 508 depends on the reflectivity of the bottom mirror 508, and the reflectivity of additional mirror 1210, the absorption of the tunable region 1010, the thickness of the tunable region 1010, and the index of refraction of the tunable region 1010. The thickness and index of refraction of the tunable region 1010 affects the relative phase between the reflection from the bottom cavity mirror 508 and the reflection from the additional mirror 1210.

The index of refraction of the tunable region 1010 (and hence the phase difference between the reflections from the bottom mirror 508 and the additional mirror 1210) may be adjusted using physical mechanisms which occur within semiconductor materials such as, for example, the thermo-optic effect, the quantum-confined Stark effect, the Franz-Keldysh effect, the Burstein-Moss effect (band filling), the electro-optic effect, and the acousto-optic effect. These effects by themselves are described in various publicly available literature. A tunable region 1010 using such physical mechanisms may optionally be built directly into a lasing SOA device to make the lasing SOA device tunable. Alternatively, the index of refraction of the tunable region 1010 may be adjusted using physical mechanisms which occur external to a semiconductor device such as, for example, a liquid crystal mechanism, an air bridge mechanism which moves or tilts the additional mirror 1210, a mechanism to change the curvature of the additional mirror, and a razor-edge or neutral density filter mechanism between the bottom mirror 508 and the additional mirror 1210.

An example of a preferred embodiment of a bottom structure (508+1010+1210) for the tunable-gain VLSOA 1200 in FIG. 12A is described as follows. In a preferred embodiment, the bottom mirror 508 is a 20 pair Bragg reflector made of quarter wavelength thick layers in alternation of AlAs (112 nanometers thick for a 1.3 micron wavelength device) and GaAs (96 nanometers thick for a 1.3 micron wavelength device). This bottom mirror 508 by itself has 99.2% reflectivity and 0.8% transmittance (for the case where the light is incident from and transmits into GaAs material). By reflecting 10% of the transmitted light back at the bottom mirror 508 by the tunable region 1010 and the additional mirror 1210, the effective reflectivity of the bottom structure (508+1010+1210) should increase from 99.2% to 99.6% according to simulations of the reflectivity. Similarly, by reflecting 20% of the transmitted light, the effective reflectivity of the bottom structure should increase to 99.7%. And, by reflecting 30% of the transmitted light, the effective reflectivity of the bottom structure should increase to 99.8%.

Figure 12B:
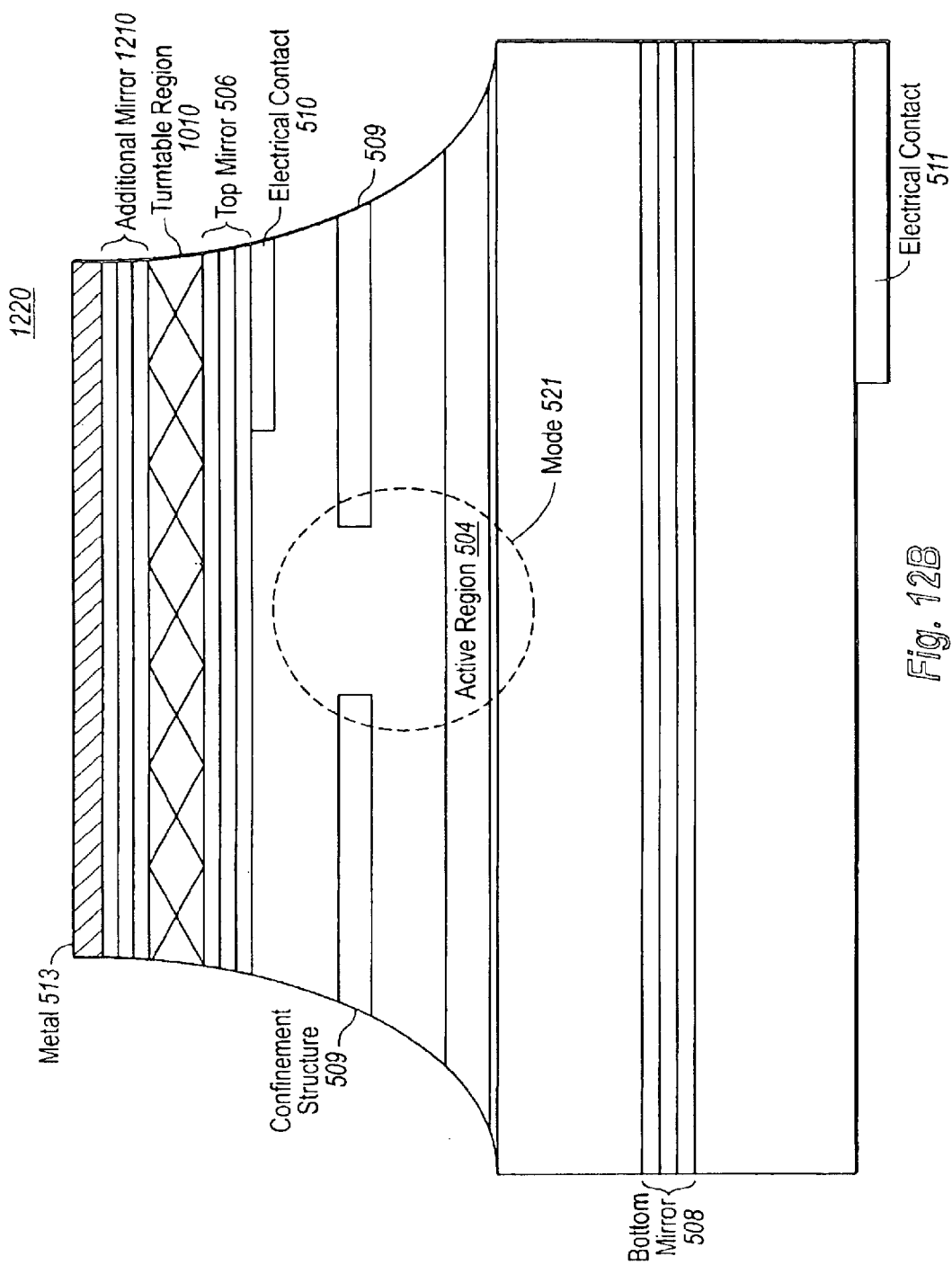
FIG. 12B is a cross-sectional diagram of a tunable-gain VLSOA 1220 which includes a tunable region 1010 between the top cavity mirror 506 and the additional mirror 1210 according to a preferred embodiment of the present invention.

FIG. 12B is a cross-sectional diagram of a tunable-gain VLSOA 1220 which includes a tunable region 1010 between the top cavity mirror 506 and the additional mirror 1210 according to a preferred embodiment of the present invention. Again, the tunable region 1010 may be a liquid crystal layer or another adjustable loss layer, and the additional mirror 1210 may be a Bragg reflector or another type of mirror.

The tunable-gain VLSOA 1220 in FIG. 12B is similar to the tunable-gain VLSOA in FIG. 12A, except that the tunable region 1010 and the additional mirror 1210 are moved from below the bottom cavity mirror 508 to above the top mirror 506. For the tunable-gain VLSOA 1220 in FIG. 12B, using only relatively rough control of the tunable region 1010, fine control is achieved over the effective reflectivity of the top cavity mirror 506 and hence over the constant gain multiplier of the tunable-gain VLSOA 1220.

Figure 12C:
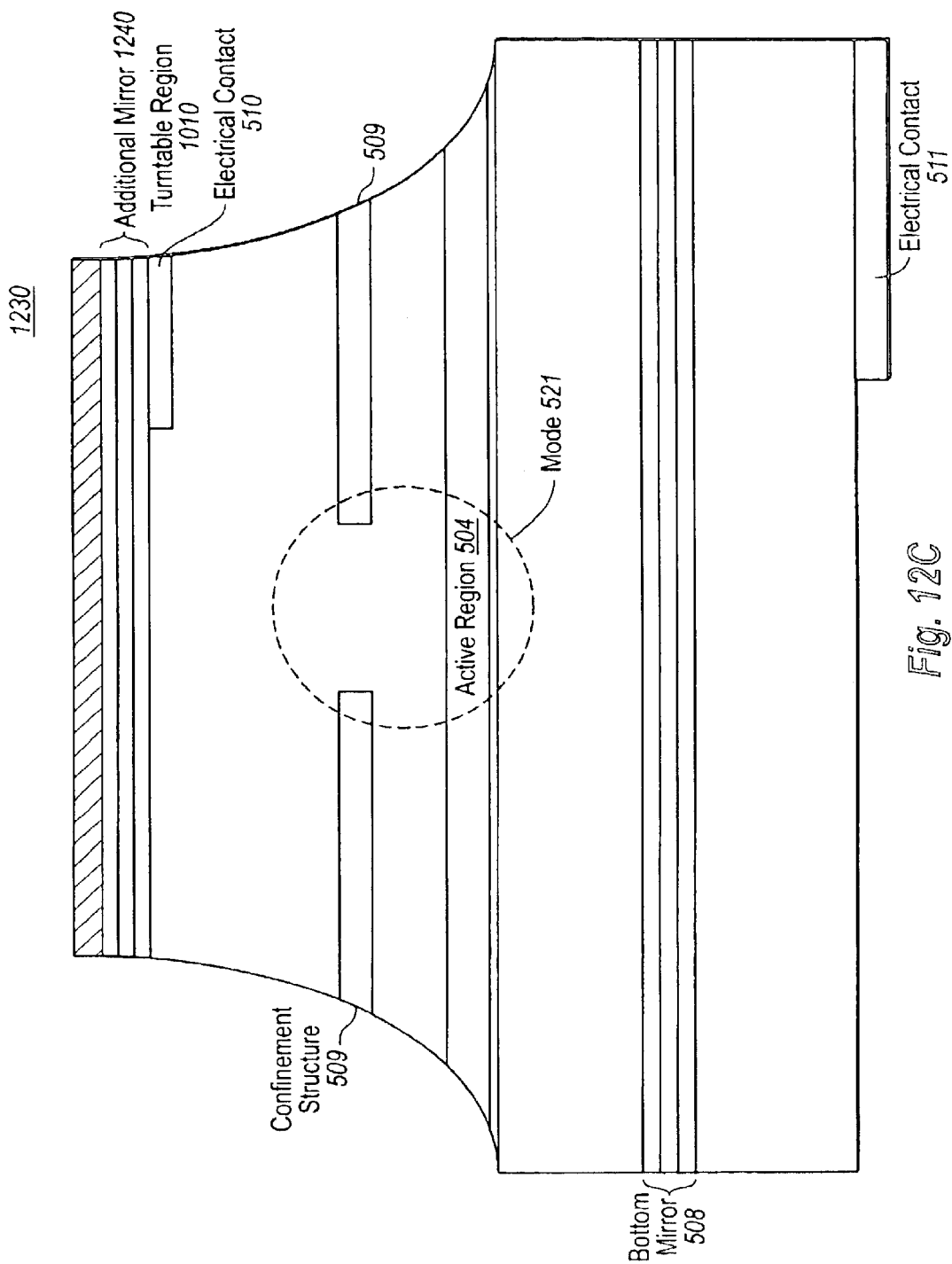
FIG. 12C is a cross-sectional diagram of a tunable-gain VLSOA 1230 including an adjustable top or bottom mirror 1240 according to an embodiment of the present invention.

FIG. 12C is a cross-sectional diagram of a tunable-gain VLSOA 1230 including an adjustable top mirror 1240 according to an embodiment of the present invention. The adjustable top mirror 1240 may be, for example, a Bragg reflector whose effective reflectivity can be adjusted by temperature adjustment, by an applied voltage, by mechanical deformation of the mirror 1240, by tilting the mirror 1240, by horizontally displacing the mirror 1240, or by some other mechanism. In another embodiment, the bottom mirror 508 is replaced by an adjustable cavity mirror 1240 as described above in the description for FIG. 12C.

Figure 13:
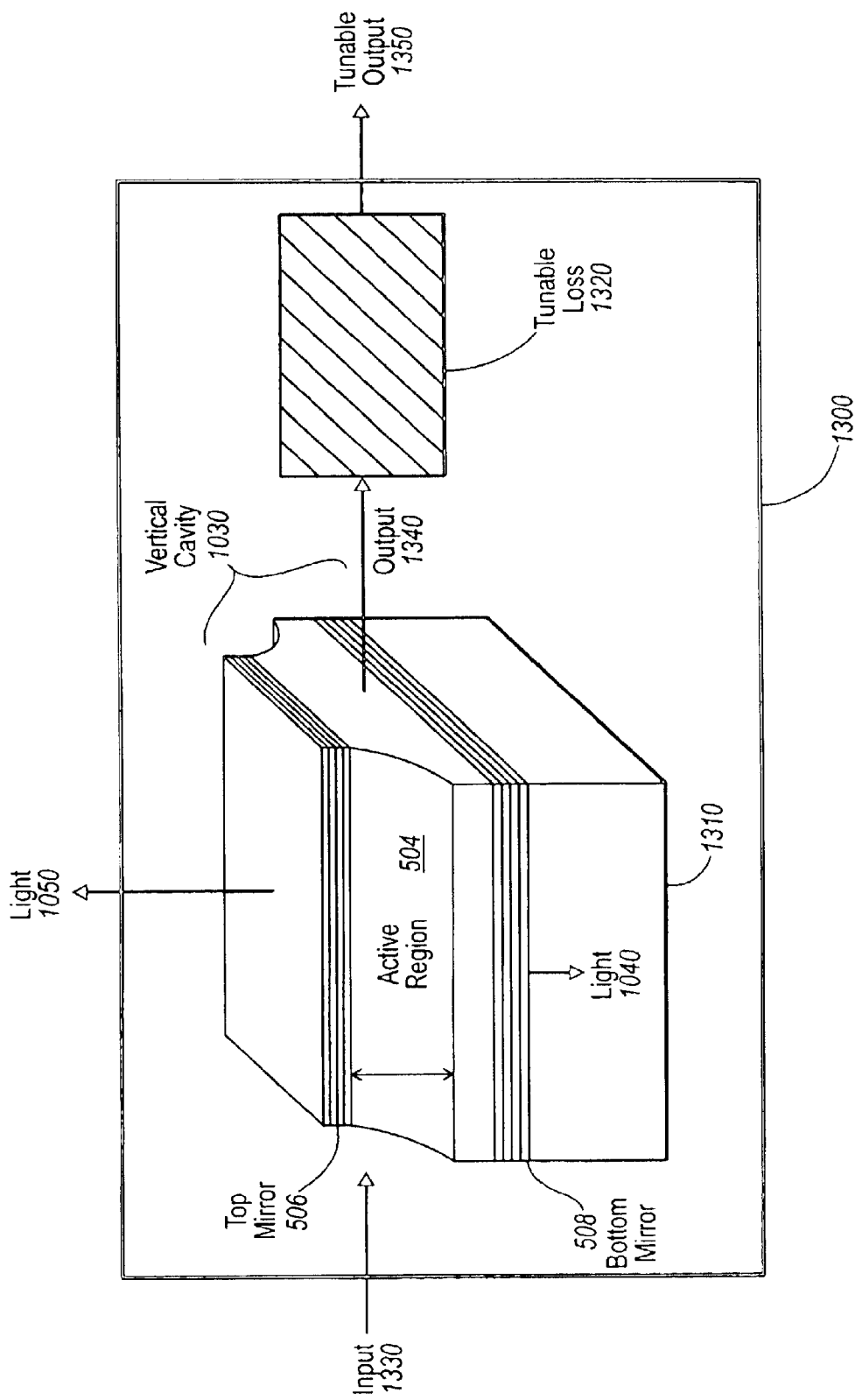
FIG. 13 is a diagram of apparatus 1300 including a lasing semiconductor optical amplifier (SOA) 1310 drawn in perspective and a tunable loss element 1320 drawn in block form according to an embodiment of the present invention.

FIG. 13 is a diagram of a tunable-gain lasing semiconductor optical amplifier apparatus 1300 including a lasing semiconductor optical amplifier (SOA) 1310 drawn in perspective and a tunable loss element 1320 depicted in block form according to a preferred embodiment of the present invention. The particular lasing SOA 1310 shown in FIG. 13 is a vertical-lasing semiconductor optical amplifier (VLSOA) as described above with reference to FIG. 5B. In a preferred embodiment of the present invention, the lasing SOA 1310 and the tunable loss element 1320 are packaged together as one apparatus 1300.

While lasing SOA 1310 is operating above the lasing threshold, an optical signal 1330 is input into the active region 504. As the optical signal 1330 travels through the active region 504, the optical signal 1330 is amplified by a constant gain multiplier due to stimulated emission of additional photons. The amplified optical signal 1340 is output from the other end of the active region 504.

The amplified optical signal 1340 is output from the lasing SOA 1310 into the tunable loss element 1320. The tunable loss element 1320 reduces the strength of the amplified optical signal 1340 by a tunable amount and thus generates a tunable amplified output 1350. The tunable loss element 1320 may comprise various types of loss elements. The tunable loss element 1320 may comprise, for example, a liquid crystal element whose transmittance is adjusted by varying the voltage across the liquid crystal. As another example, the tunable loss element 1320 may comprise an element which uses the positioning of a razor edge within the element to adjust the loss induced by the element. As yet another example, the tunable loss element 1320 may comprise an optical attenuator which uses a coupling loss between two fibers to adjust attenuation. As a final example, the tunable loss element 1320 may use graded index (GRIN) lenses to expand the entering optical signal 1340, refocus the exiting optical signal 1350, and place a tunable filter in the expanded beam within the tunable loss element 1320.

An alternative embodiment of the apparatus in FIG. 13 positions the tunable loss element 1320 before the lasing SOA 1310 such that the tunable loss element 1320 receives the input optical signal 1330. However, in such an embodiment, the noise introduced by tunable loss element 1320 is amplified in lasing SOA 1310.

Figure 14:
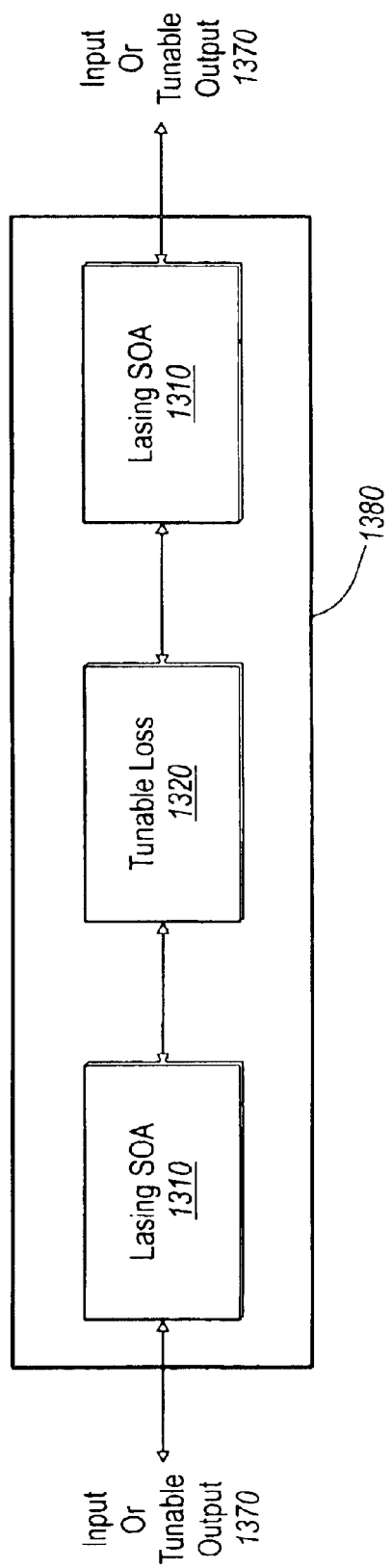
FIG. 14 is a block diagram of a bi-directional apparatus 1380 including two lasing SOAs 1310 and a tunable loss element 1320 according to an embodiment of the present invention.

In applications where bi-directional signals are present, a preferred embodiment places the tunable loss element 1320 between two lasing SOA devices 1310, as shown in FIG. 14. Either end 1370 of the bi-directional apparatus 1380 shown in FIG. 14 may either receive an input signal or send a tunable output signal.

Other embodiments of the tunable gain amplifier are also possible. For example, tunable gain amplifier 410 illustrated in FIG. 4B of U.S. patent application Ser. No. 09/273,813, "Tunable-gain Lasing Semiconductor Optical Amplifier", by Jeffrey D. Walker, Sol P. Dijaili and Daniel A. Francis, filed Mar. 22, 1999, is another embodiment that could be used.

Figure 15:
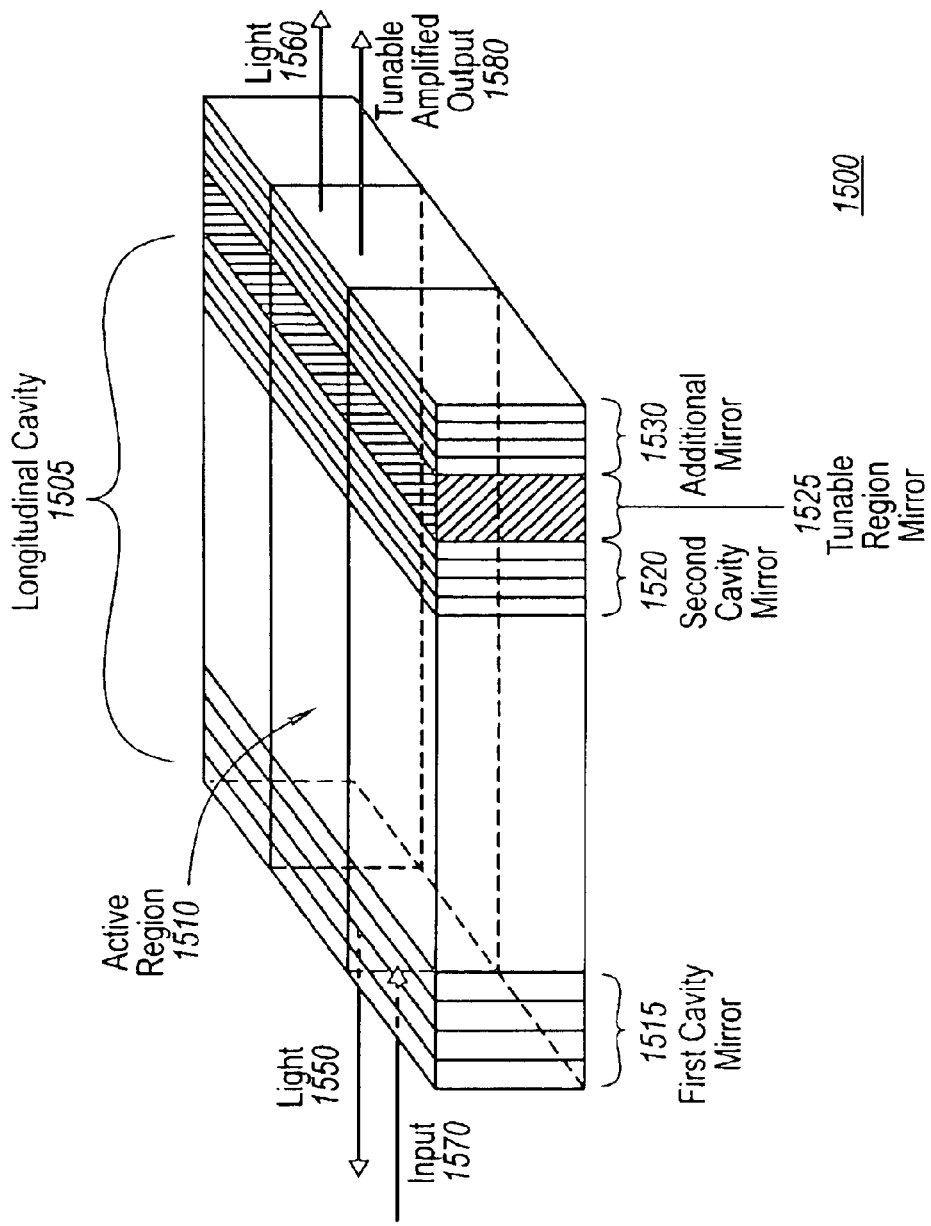
FIG. 15 is a diagram of a tunable-gain longitudinally lasing semiconductor optical amplifier (LLSOA) 1500 according to an embodiment of the present invention.

FIG. 15 is a diagram of a tunable-gain longitudinally lasing semiconductor optical amplifier (LLSOA) 1500 according to an embodiment of the present invention. The tunable-gain LLSOA 1500 includes a longitudinal optical cavity 1505 which includes an active region 1510 sandwiched between a first cavity mirror 1515 and a second cavity mirror 1520. A tunable loss layer 1525 is sandwiched between the second cavity mirror 1520 and an additional mirror 1530. The active region 1510 is pumped such that a lasing threshold of the longitudinal cavity 1505 is reached and then surpassed. As a result, laser light 1550 and/or 1560 may be output from the longitudinal cavity 1505 via either the first mirror 1515 or the additional mirror 1530.

An optical signal 1570 is input into a surface of the first mirror 1515 and proceeds to the active region 1510 where the optical signal 1570 is amplified. The effective reflectivity of the second mirror 1520 is adjusted by way of the tunable region 1525 and the additional mirror 1530. By so adjusting the effective reflectivity of the second mirror 1520, the amplification applied to the optical signal 1570 may be tuned. For the tunable-gain LLSOA 1500, typical mirror reflectivity is about 1%. In a preferred embodiment of the tunable-gain LLSOA 1500, the tunable region 1525 is an electrically pumped transparent semiconductor waveguide acting as a phase-shifting layer. In this type of phase-shifting layer, the waveguide region has a large enough bandgap so that it is transparent to the signal, and electrons and/or holes are injected into the region to cause a change in refractive index of the material. Such an embodiment could be fabricated using techniques similar to techniques for fabricating wavelength tunable distributed Bragg reflector (DBR) laser diodes, and it would avoid problems of saturation that may occur if an absorbing layer was used as the tunable region 1525.

For example, suppose the reflectivity of the second cavity mirror 1520 is about 1%, and the reflectivity of the additional mirror 1530 is about 1%. If the tunable region 1525 is such that the two mirrors 1520 and 1530 are in phase, then the effective reflectivity of the second cavity mirror 1520 would be greater than 1% On the other hand, if the phase of the tunable region 1525 is such that the two mirror reflectivities are out of phase, then the effective reflectivity of the second cavity mirror would be less than 1%. The phase of the tunable region 1525 may be adjusted by changing the index of refraction in the layer 1525. Hence, controlling the index of refraction in the tunable region 1525 results in adjustments to the effective reflectivity of the second cavity mirror 1520. The length and bandgap of the tunable region 1525 can be designed to give a desired phase shift for a given electrical current injected into the tunable region 1525. Using only relatively rough control of the electrical current, fine control may be achieved over the effective reflectivity of the second cavity mirror 1520 and hence over the value of the gain multiplier of the tunable-gain LLSOA 1500.

The tunable-gain LLSOA 1500 in FIG. 15 is similar to the tunable-gain VLSOA embodiment 1200 in FIG. 12A. Other tunable-gain LLSOA embodiments 1500 are possible. For example, the additional mirror 1530 may be placed to receive the input optical signal 1570, and the tunable loss 1525 may be sandwiched between the additional mirror 1530 and the first mirror 1515. Similarly, the reflectivity of the first 1515 or the second mirrors 1520 may be adjusted by various mechanisms. Furthermore, an apparatus may be made which comprises an LLSOA in series with a tunable loss element.

Figure 16:
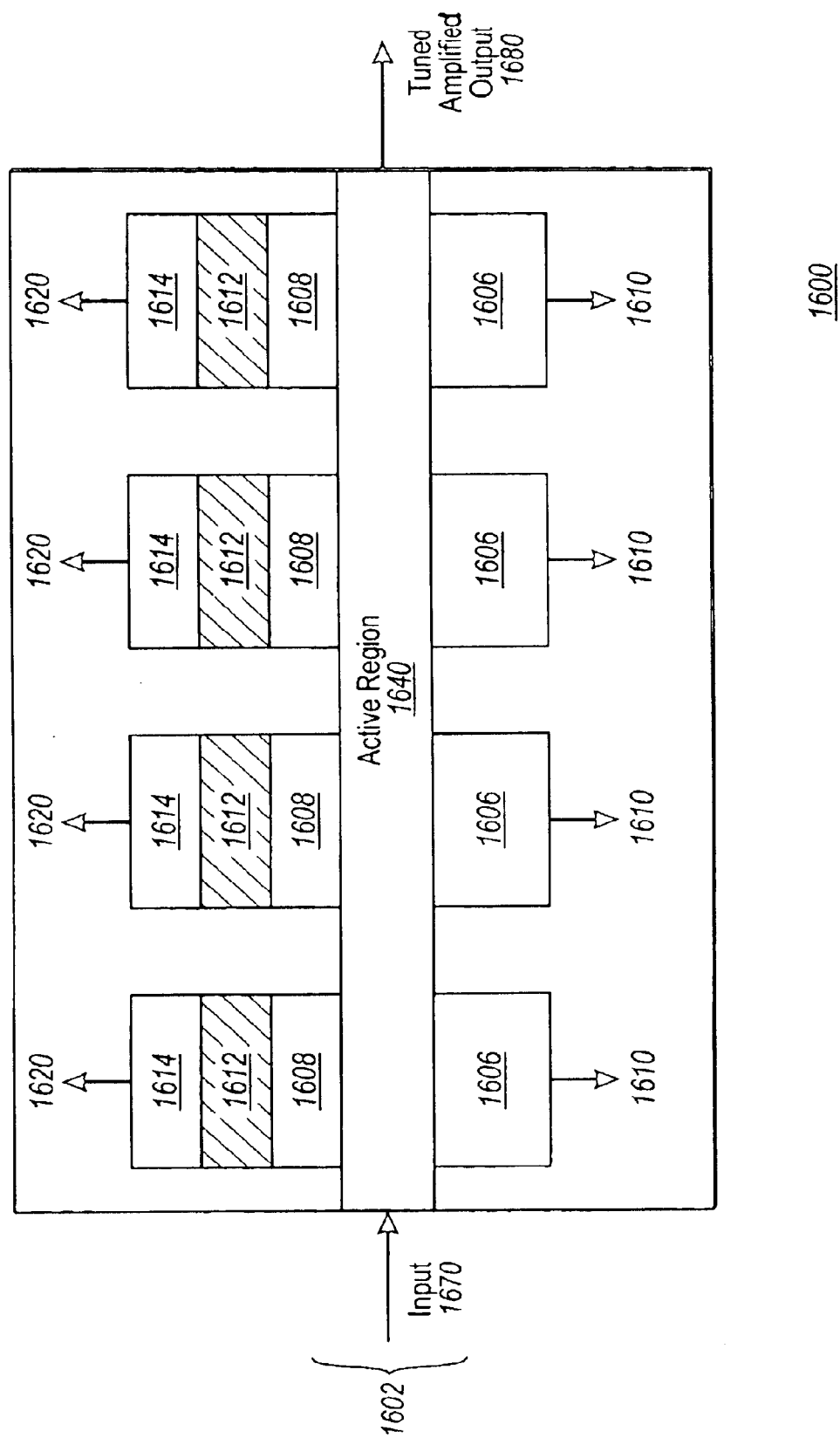
FIG. 16 is a top view of tunable-gain transverse lasing semiconductor optical amplifier (TLSOA) 1600 according to an embodiment of the present invention.

FIG. 16 is a top view of a tunable-gain transverse lasing semiconductor optical amplifier (TLSOA) 1600 according to an embodiment of the present invention.

The tunable-gain TLSOA 1600 includes a transverse optical cavity 1602 which comprises an active region 1640 sandwiched between a right cavity mirror 1606 and a left cavity mirror 1608. A tunable region 1612 is sandwiched between the left cavity mirror 1608 and an additional mirror 1614. The active region 1640 is pumped such that a lasing threshold of the transverse cavity 1602 is reached and then surpassed. As a result, laser light 1610 and/or 1620 may be output from the transverse cavity 1602 via either the right mirror 1606 or the additional mirror 1614.

An optical signal 1670 is input into a surface of the active region 1640 and is amplified as it passes through the active region 1640. The effective reflectivity of the left mirror 1608 is adjusted by way of the tunable region 1612 and the additional mirror 1614. By so adjusting the effective reflectivity of the left mirror 1608, the amplification applied to the optical signal 1670 may be tuned.

The tunable-gain TLSOA 1600 in FIG. 16 is similar to the tunable-gain VLSOA embodiment 1200 in FIG. 12A. Many other tunable-gain TLSOA embodiments 1600 are possible. For example, the additional mirror 1614 may be placed on the right side, and the tunable region 1612 may be sandwiched between the additional mirror 1614 and the right mirror 1606. Similarly, the reflectivity of the right 1606 or the left 1608 mirrors may be adjusted by various other mechanisms. Furthermore, an apparatus may be made which comprises an LLSOA in series with a tunable loss element.

The above description is included to illustrate various embodiments of the present invention and is not meant to limit the scope of the invention. From the above description, many variations will be apparent to one skilled in the art that would yet be encompassed by the spirit and scope of the invention. For example, the principles described above may also be applied to rare-earth waveguide amplifiers, including those based on erbium, praseodymium, neodymium, and thulium. In addition, the optical amplifier stages described above are not limited to a single optical amplifier. For example, the optical amplifier stages could be comprised of multiple optical amplifiers in parallel, each designed to amplify a specific wavelength of the optical signal that is divided into various wavelengths when received at the input to the optical amplifier stage and recombined before being output from the optical amplifier stage. The scope of the invention is to be limited only by the following claims.

What is claimed is:

1. A multi-stage tunable gain optical amplifier for amplifying an optical signal comprising:
   (a) an optical amplifier stage comprising a gain medium having an amplifying path for amplifying an optical signal propagating along the amplifying path; and
   (b) a tunable-gain lasing semiconductor optical amplifier (SOA) stage comprising:
      a semiconductor gain medium having an amplifying path for amplifying an optical signal propagating along the amplifying path, wherein the amplifying path of the tunable-gain lasing SOA stage and the amplifying path of the optical amplifier stage are coupled in series,
      a laser cavity including the semiconductor gain medium, wherein pumping the laser cavity above a lasing threshold substantially clamps a gain of the semiconductor gain medium to constant value, and
      wherein an overall gain of the tunable-gain lasing SOA stage is tunable.

2. The multi-stage tunable gain optical amplifier of claim 1 wherein:
   the optical amplifier stage precedes the tunable-gain lasing SOA stage; and
   the optical amplifier stage has better noise performance than the tunable-gain lasing SOA stage.

3. The multi-stage tunable gain optical amplifier of claim 1 wherein:

the tunable-gain lasing SOA stage precedes the optical amplifier stage; and the optical amplifier has a higher output power than the tunable-gain lasing SOA stage.

4. The multi-stage tunable gain optical amplifier of claim 1 wherein the optical amplifier stage comprises a semiconductor optical amplifier integrated on a common substrate with the tunable-gain lasing SOA stage.

5. The multi-stage tunable gain optical amplifier of claim 1 wherein the tunable-gain lasing SOA stage comprises a tunable gain vertical lasing semiconductor optical amplifier (VLSOA).

6. The multi-stage tunable gain optical amplifier of claim 5 wherein the optical amplifier stage comprises either a non-lasing semiconductor optical amplifier or a VLSOA integrated on a common substrate with the VLSOA of the tunable-gain lasing SOA stage.

7. The multi-stage tunable gain optical amplifier of claim 1 wherein the tunable-gain lasing SOA stage further comprises:

a tunable loss element coupled in series with the amplifying path of the tunable-gain lasing SOA stage.

8. The multi-stage tunable gain optical amplifier of claim 1 wherein the constant value to which the gain of the semiconductor gain medium is clamped is tunable.

9. The multi-stage tunable gain optical amplifier of claim 1 wherein the optical amplifier stage comprises a continuously flared VLSOA.

10. The multi-stage tunable gain lasing semiconductor optical amplifier of claim 1 wherein the tunable gain optical amplifier stage comprises a continuously flared tunable gain VLSOA.

11. A multi-stage tunable gain optical amplifier for amplifying an optical signal, the multi-stage tunable gain optical amplifier comprising a first, a second and a third optical amplifier stage coupled in series, wherein:

the first optical amplifier stage has better noise performance than the second optical amplifier stage;

the third optical amplifier stage has a higher power output than the second optical amplifier stage; and the second optical amplifier stage includes a tunable-gain lasing semiconductor optical amplifier (SOA) stage comprising:

a semiconductor gain medium having an amplifying path for amplifying an optical signal propagating along the amplifying path, a laser cavity including the semiconductor gain medium, wherein pumping the laser cavity above a lasing threshold substantially clamps a gain of the semiconductor gain medium to a constant value, and an overall gain of the tunable-gain lasing SOA stage is tunable.

12. The multi-stage tunable gain optical amplifier of claim 11 wherein:

the first optical amplifier stage includes an optical pre-amplification stage; and the third optical amplifier stage includes an optical power booster stage.

13. The multi-stage tunable gain optical amplifier of claim 11 wherein:

the first optical amplifier stage includes either a non-lasing semiconductor optical amplifier or a VLSOA;

the second optical amplifier stage includes a VLSOA;

the third optical amplifier stage includes a VLSOA; and the VLSOA's and non-lasing semiconductor optical amplifier are integrated on a common substrate.

14. The multi-stage tunable gain optical amplifier of claim 11 wherein at least one of the first or third optical amplifier stages comprises a continuously flared VLSOA.

15. The multi-stage tunable gain lasing semiconductor optical amplifier of claim 11 wherein the second optical amplifier stage comprises a continuously flared tunable gain VLSOA.

16. A tunable gain lasing semiconductor optical amplifier (SOA) device for amplifying an optical signal, the device comprising:

an input for receiving the optical signal;

an output for transmitting an amplified version of the optical signal;

a semiconductor gain medium having an amplifying path coupled between the input and the output for amplifying the optical signal propagating along the amplifying path;

a laser cavity including the semiconductor gain medium;

a pump input coupled to the semiconductor gain medium for receiving a pump to pump the semiconductor gain medium above a lasing threshold for the laser cavity, whereby a gain of the semiconductor gain medium is clamped to a gain value which is substantially independent of an amplitude of the optical signal propagating along the amplifying path;

wherein each point along the amplifying path is characterized by a design parameter which varies along the amplifying path; and wherein the gain is tunable at some point along the amplifying path.

* * * * *